United States Patent
Fujii et al.

(10) Patent No.: US 6,710,607 B2
(45) Date of Patent: Mar. 23, 2004

(54) METHOD AND APPARATUS FOR INSPECTION

(75) Inventors: Tatuhisa Fujii, Fukuyama (JP); Shogo Ishioka, Fukayasu-gun (JP); Shuji Yamaoka, Fukuyama (JP)

(73) Assignee: OHT, Inc., Hiroshima (JP)

( * ) Notice: Subject to any disclaimer, the term of this patent is extended or adjusted under 35 U.S.C. 154(b) by 0 days.

(21) Appl. No.: 09/926,606

(22) PCT Filed: Mar. 23, 2001

(86) PCT No.: PCT/JP01/02335
§ 371 (c)(1),
(2), (4) Date: Nov. 26, 2001

(87) PCT Pub. No.: WO01/71369
PCT Pub. Date: Sep. 27, 2001

(65) Prior Publication Data
US 2002/0135390 A1 Sep. 26, 2002

(30) Foreign Application Priority Data
Mar. 24, 2000 (JP) .................................... 2000-084894

(51) Int. Cl.[7] .............................................. G01R 31/02
(52) U.S. Cl. ......................................... 324/750; 324/538
(58) Field of Search ................................ 324/750, 501, 324/537, 538, 95, 158.1, 761, 555

(56) References Cited

U.S. PATENT DOCUMENTS

| | | | |
|---|---|---|---|
| 4,055,801 A | * | 10/1977 | Pike et al. .................. 714/736 |
| 5,006,788 A | * | 4/1991 | Goulette et al. .............. 324/95 |
| 5,124,660 A | * | 6/1992 | Cilingiroglu ................. 324/538 |
| 5,218,294 A | * | 6/1993 | Soiferman ............... 324/158.1 |
| 5,424,633 A | * | 6/1995 | Soiferman ............... 324/158.1 |
| 5,714,888 A | * | 2/1998 | Naujoks ..................... 324/750 |
| 5,757,193 A | * | 5/1998 | Yu et al. ..................... 324/501 |
| 6,201,398 B1 | | 3/2001 | Takada ....................... 324/537 |

FOREIGN PATENT DOCUMENTS

| | | |
|---|---|---|
| JP | 7-83954 | 3/1995 |
| JP | 9-264919 | 10/1997 |
| JP | 2000-55991 | 2/2000 |

* cited by examiner

Primary Examiner—Ernest Karlsen
(74) Attorney, Agent, or Firm—Westerman, Hattori, Daniels & Adrian, LLP

(57) ABSTRACT

The present invention provides an inspection apparatus and method capable of intuitively obtaining inspection results of circuit wirings. An inspection system 20 comprises a sensor chip 1 including plural sensor elements, a computer 21, probes 22 for supplying an inspection signal to circuit wirings 101, and a selector 23 for switching the supply of the inspection signal to the probes 22. The computer 21 receives the detected signals from the sensor chip 1, and generates an image data to display an image of the circuit wirings as an inspection subject on a display 21a. This make it possible to check the shape of the specific circuit wiring and to detect defects such as disconnection, short-circuit, and chipping in the circuit wiring 101 based on the generated image data and the design image data representing the design circuit wiring.

11 Claims, 22 Drawing Sheets

| circuit wiring No | upper left coordinate of inspection region | bottom right coordinate of inspection region | frame |
|---|---|---|---|
| circuit wiring ① | ( X2,Y1 ) | ( X6,Y3 ) | 1 |
| circuit wiring ② | ( X1,Y1 ) | ( X6,Y4 ) | 1 |
| circuit wiring ③ | ( X1,Y4 ) | ( X4,Y6 ) | 1 |
| . | . | . | . |
| . | . | . | . |
| . | . | . | . |

Fig. 12

| sequence for applying voltage | circuit wiring No. | upper left coordinate of inspection region | bottom right coordinate of inspection region | frame |
|---|---|---|---|---|
| 1 | circuit wiring ① | ( X2,Y1 ) | ( X5,Y3 ) | 1 |
| 2 | circuit wiring ② | ( X1,Y4 ) | ( X4,Y6 ) | 1 |
| 3 | circuit wiring ③ | ( X1,Y1 ) | ( X6,Y4 ) | 2 |
| · | · | · | · | · |
| · | · | · | · | · |

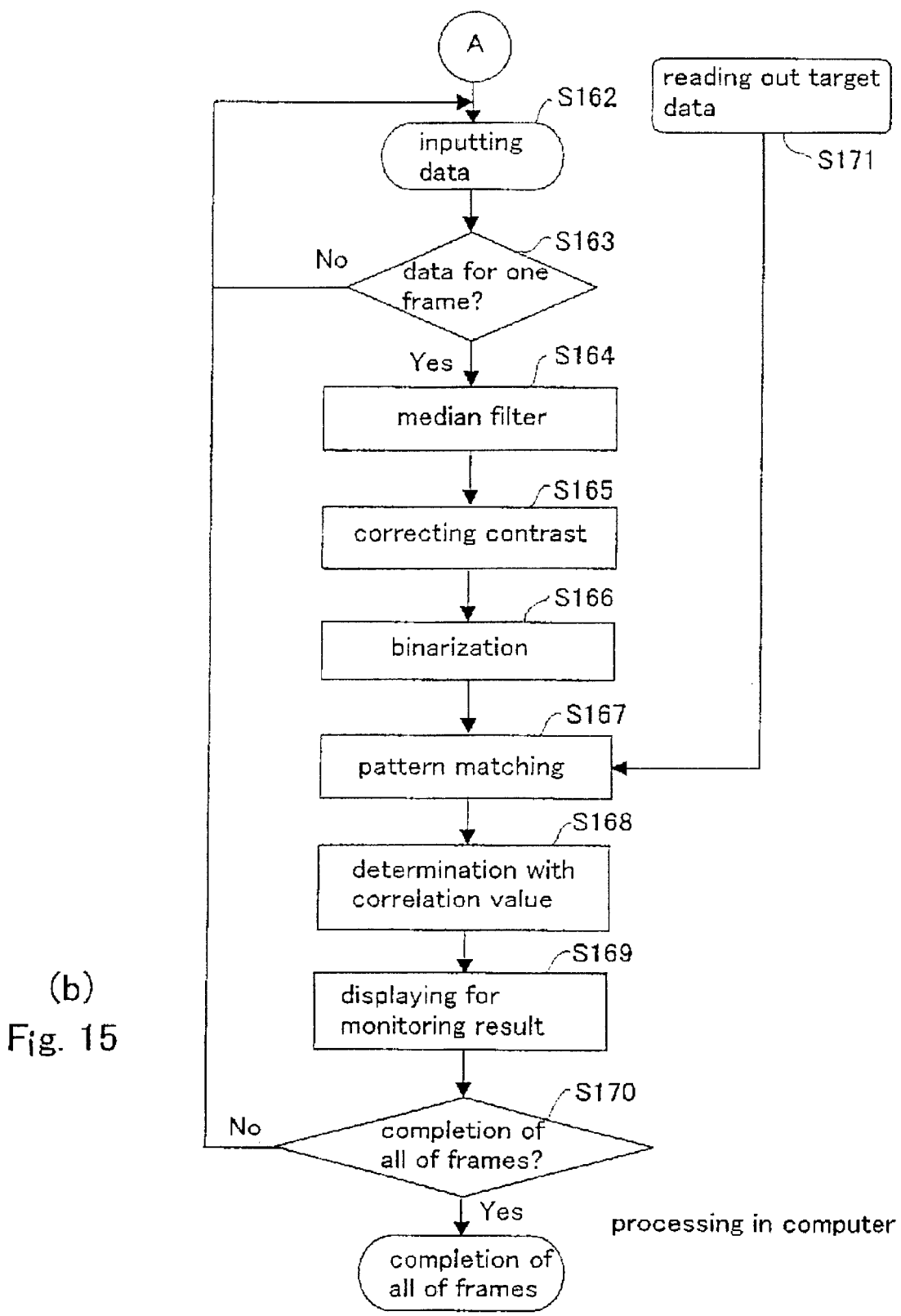
(b) Fig. 15

METHOD AND APPARATUS FOR INSPECTION

TECHNICAL FIELD

The present invention relates to an apparatus and method for inspecting a circuit board.

BACKGROUND ART

In manufacturing processes of a circuit board, after forming circuit wirings on a board, it is required to inspect the presence of disconnection and/or short-circuit in the circuit wirings.

The recent progressive densification in the circuit wirings makes it difficult to assure a sufficient space for arranging two separate inspection pins simultaneously and bringing them into contact with the circuit wirings to be inspected. Thus, a non-contact type inspection technique has been proposed in which electric signals were received without using any pin and contacting the circuit wirings (see Japanese Patent Laid-Open Publication No. Hei 9-264919).

As is shown in FIG. 22, in this non-contact type inspection technique, the disconnection or the like is inspected by bringing a pin into contact with one end of the ends of a circuit wiring to be inspected, placing a sensor conductor at the other end of the circuit wiring in non-contact manner, and then detecting with the sensor conductor a potential variation in the circuit wiring caused by supplying an inspection signal to the pin.

However, the above conventional non-contact type inspection technique allows an operator only to determine whether the circuit wiring is present at a given position on a circuit board, but does not allow the operator to intuitively determine the geometry or shape of the circuit wiring.

The present invention is directed to solve the above problem of the conventional technique. It is therefore an object of the present invention to provide an inspection apparatus and inspection method capable of intuitively inspecting a shape of a circuit wiring.

DISCLOSURE OF THE INVENTION

In order to achieve the above object, according to a first aspect of the present invention, there is provided an inspection apparatus for inspecting a circuit wiring on a circuit board, comprising: supply means for supplying an inspection signal to the circuit wiring; detecting means for detecting potential variation appearing in the circuit wiring in response to the inspection signal, by use of plural sensor elements; and image data generating means for generating an image data representing the shape of the circuit wiring, by use of positional information of the sensor elements which have detected the potential variation.

In the inspection apparatus according to the first aspect of the present invention, the supply means may be adapted to supply the inspection signal to the different circuit wiring at a different timing. The term "difference circuit wiring" herein means the electrically separated part of the circuit wiring, which should not be electrically conducted to the remaining part of the circuit wiring in design.

Further, the inspection apparatus may include selecting means for supplying a select signal to selectively drive a part of the plural sensor elements located in a given region of the circuit board.

In the inspection apparatus according to the first aspect of the present invention, the plural sensor elements may be arranged in a matrix form, and the selecting means may be adapted to input the select signal simultaneously into plural sensor element lines which are formed by the plural sensor elements and each of which is aligned horizontally in one line. In addition, the detecting means may be adapted to simultaneously detect the potential variation appearing in the circuit wiring opposed to the sensor element lines.

In this case, the inspection apparatus may further include timing control means for controlling the timing for inputting the select signal to the sensor element lines, the timing for detecting the potential variation from the sensor element lines, and the timing for supplying the inspection signal to the circuit wiring.

Further, the circuit wiring may include a first circuit wiring and a second circuit wiring. In this case, the selecting means may be adapted to drive all of the sensor elements by sequentially inputting the select signal to the sensor element lines, and the detecting means may be adapted to detect the potential variation from all of the sensor elements in conformity with the timing for inputting the select signal from the selecting means. In addition, when a first set of the sensor element lines capable of detecting the potential variation in the first circuit wiring and a second set of the sensor element lines capable of detecting the potential variation in the second circuit wiring are not overlapped at all, the supply means may be adapted to supply the inspection signal to the first and second circuit wirings within the same frame, where a period in which all of the sensor elements are driven once is defined as one frame. Furthermore, when the first and second sets of the sensor element lines are overlapped each other, the supply means may be adapted to supply the inspection signal to the first and second circuit wirings in different frames.

Otherwise, in case of the circuit wiring including a first circuit wiring and a second circuit wiring, the selecting means may be adapted to drive all of the sensor elements by sequentially inputting the select signal vertically to the sensor element lines, and the detecting means may be adapted to detect the potential variation from all of the sensor elements in conformity with the timing for inputting the select signal from the selecting means. In this case, when a first set of the sensor element lines capable of detecting the potential variation in the first circuit wiring and a second set of the sensor element lines capable of detecting the potential variation in the second circuit wiring are overlapped each other, the supply means may be adapted to supply the inspection signal to the first and second circuit wirings within the same frame in different timings, where a period in which all of the sensor elements are driven once is defined as one frame.

Furthermore, the timing control means may be adapted to control the timing for inputting the select signal, the timing for detecting the potential variation from the sensor element lines, and the timing for supplying the inspection signal to the circuit wirings, so as to drive the first set of the sensor element lines which are arranged at the interval of n lines and provided for detecting the first circuit wiring, and the second set of the sensor element lines which are arranged differently from the first set of the sensor element lines at the interval of n lines and provided for detecting the second circuit wiring.

Alternatively, the timing control means may be adapted to control the timing for inputting the select signal, the timing for detecting the potential variation from the sensor element lines, and the timing for supplying the inspection signal to the circuit wirings, so as to drive the first set of the sensor element lines which are arranged at odd lines and provided for detecting the first circuit wiring, and the second set of the sensor element lines which are arranged at even lines and provided for detecting the second circuit wiring.

The image data generating means may be adapted to generate the image data representing each shape of the first and second circuit wirings through an image interpolation process.

According to a second aspect of the present invention, there is provided an inspection apparatus for inspecting plural circuit wirings on a circuit board, comprising: supply means for supplying an inspection signal to each of the plural circuit wirings; first and second area type sensors each opposed to the plural circuit wirings to detect potential variation appearing in the plural circuit wirings in response to the inspection signal; and timing control means for controlling the timing for detecting the potential variations by the sensors. In this case, each of the first and second area type sensors includes plural sensor element lines and is adapted to drive the sensor elements corresponding to the entire area of each of the sensor by sequentially driving the sensor element lines vertically, and at least one of the sensor element lines in the second area type sensor is adapted to detect the potential variation in the circuit wiring opposed thereto between the time after one of the plural sensor element lines in the second area type sensor completes the detection of the potential variation in the circuit wiring opposed thereto and the time before another sensor element line subsequently starts the detection of the potential variation in the circuit wiring opposed thereto.

In the inspection apparatus according to the first or second aspect of the present invention, each of the sensor elements may be formed on a monocrystal of semiconductor or a flat plate, and each of the sensor elements may be adapted to operate as a counter electrode capacitively coupled to the circuit wiring. Further, each of the sensor elements may include a passive element detecting the potential variation in the circuit wiring, and a transistor outputting a detected signal, which is output from the passive element, in response to the input of the select signal.

In order to the above object, according to a third aspect of the present invention, there is provided an inspection method for inspecting a circuit wiring on a circuit board, comprising the steps of: supplying an inspection signal to the circuit wirings; detecting potential variations appearing in the circuit wiring in response to the inspection signal, by use of plural sensor elements; and generating an image data representing the shape of the circuit wiring by use of positional information of the sensor elements which have detected the potential variation.

BRIEF DESCRIPTION OF THE DRAWINGS

FIG. 12 shows a table for determining a sequence for applying a voltage to a plurality of circuit wirings, in the inspection system according to the first embodiment of the present invention;

FIG. 13 shows a table for determining a sequence for applying a voltage to a plurality of circuit wirings, in the inspection system according to the first embodiment of the present invention;

BEST MODE FOR CARRYING OUT THE INVENTION

With reference to the drawings, preferred embodiments of the present invention will now be illustratively described in detail. However, it is intended that the scope of the present invention is not limited only to relative configurations of each component, numerical values and others described in these embodiments, unless they are defined by a particular description.

First Embodiment

A first embodiment of the present invention will be described in conjunction with an inspection system 20 using a MOSFET as a sensor element.

Construction of Inspection System

Figure 2:
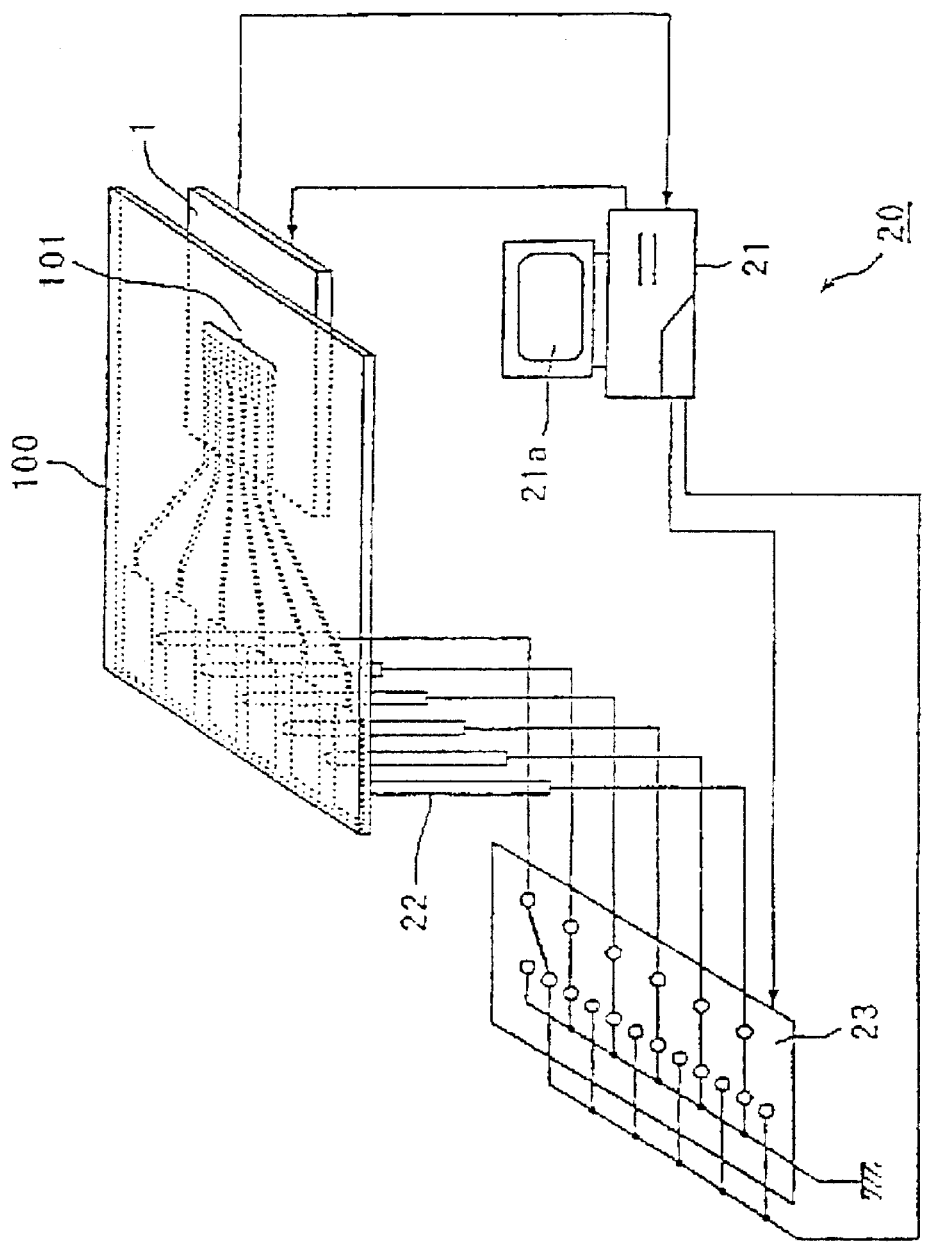
FIG. 2 is a schematic diagram of the inspection system according to the first embodiment of the present invention.

FIG. 2 is a schematic diagram of the inspection system 20 for inspecting circuit wires 101 formed on a circuit board 100.

The inspection system 20 comprises a sensor chip 1 having a plurality of sensor elements, a computer 21, a plurality of probes 22 each for supplying an inspection signal to the corresponding circuit wire 101 to be inspected, i.e. inspection circuit wire, and a selector 23 for switching the inspection signal to be supplied to at least one of the probes 22. For example, the selector 23 may be composed of a multiplexer or a duplexer.

The computer 21 supplies to the selector 23 a control signal for selecting at least one of the probes and the inspection signal to be supplied to at least one of the inspection circuit wires 101. The computer 21 also supplies to the chip sensor 1 a synchronizing signal [a vertical synchronizing signal (Vsync), a horizontal synchronizing signal (Hsync), and a reference signal (Dclk)] for allowing the sensor elements to be operated in sync with the control signal supplied to the selector 23.

The inspection signal to be applied may be either a voltage pulse or an AC signal. The use of the voltage pulse allows the polarity of the signal to be limited so that the related circuit design may be made with limiting the current direction in the sensor elements to one direction so as to simplify the circuit design.

Further, the computer 21 receives a detected signal from the sensor chip 1 to generate an image data, and then displays an image of the inspection circuit wire on a display 21a of the computer 21. This makes it possible to find out the shape of any specific circuit wiring and to detect defects, such as disconnection, short circuit or chipping in the circuit wiring 101 based on the generated image data and a design image data representing a corresponding design circuit wiring.

Each of the probes 22 has a tip contacting one of the ends of the circuit wire 101 on the circuit board 100 to supply the inspection signal to the inspection circuit wiring 101.

The selector 23 is switched to select at least one of the probes 22 to which the inspection signal is output. Specifically, the selector 23 is controlled based on the control signal supplied from the computer to allow each of the plural independent circuit wirings 101 on the circuit board 100 to be supplied with the inspection signal separately. Further, the selector 23 connects the circuit wirings not supplied with the inspection signal, i.e. non-inspection circuit wirings, to a low impedance line such as GND or a power source. This is done to prevent the sensor elements from receive an error signal otherwise arising from the transferred inspection signal to the non-inspection circuit wirings due to cross talk.

The sensor chip 1 is disposed at a position opposed to the circuit wirings 101 on the circuit board 100 in a non-contact manner to detect a potential variation on the inspection circuit wiring 101 caused by the inspection signal supplied from the corresponding probe 22 and then output the detected potential variation to the computer 21 as the detected signal. The distance between the sensor chip 1 and the circuit wirings is preferably 0.05 mm or less. However, the detected signal can be obtained if the distance is 0.5 mm or less. In addition, a dielectric insulating material may be interposed between the circuit board and the sensor chip 1 to bring them into close contact with each other.

While this embodiment is described on the assumption that the circuit wirings 101 are formed only on one of the side surfaces of the circuit board 100 of FIG. 2, a circuit board having side surfaces both having the conductive pattern thereon can also be inspected. In this case, the inspection operation may be performed by preparing a pair of sensor chips 1 and sandwiching the circuit board between them.

Figure 3:
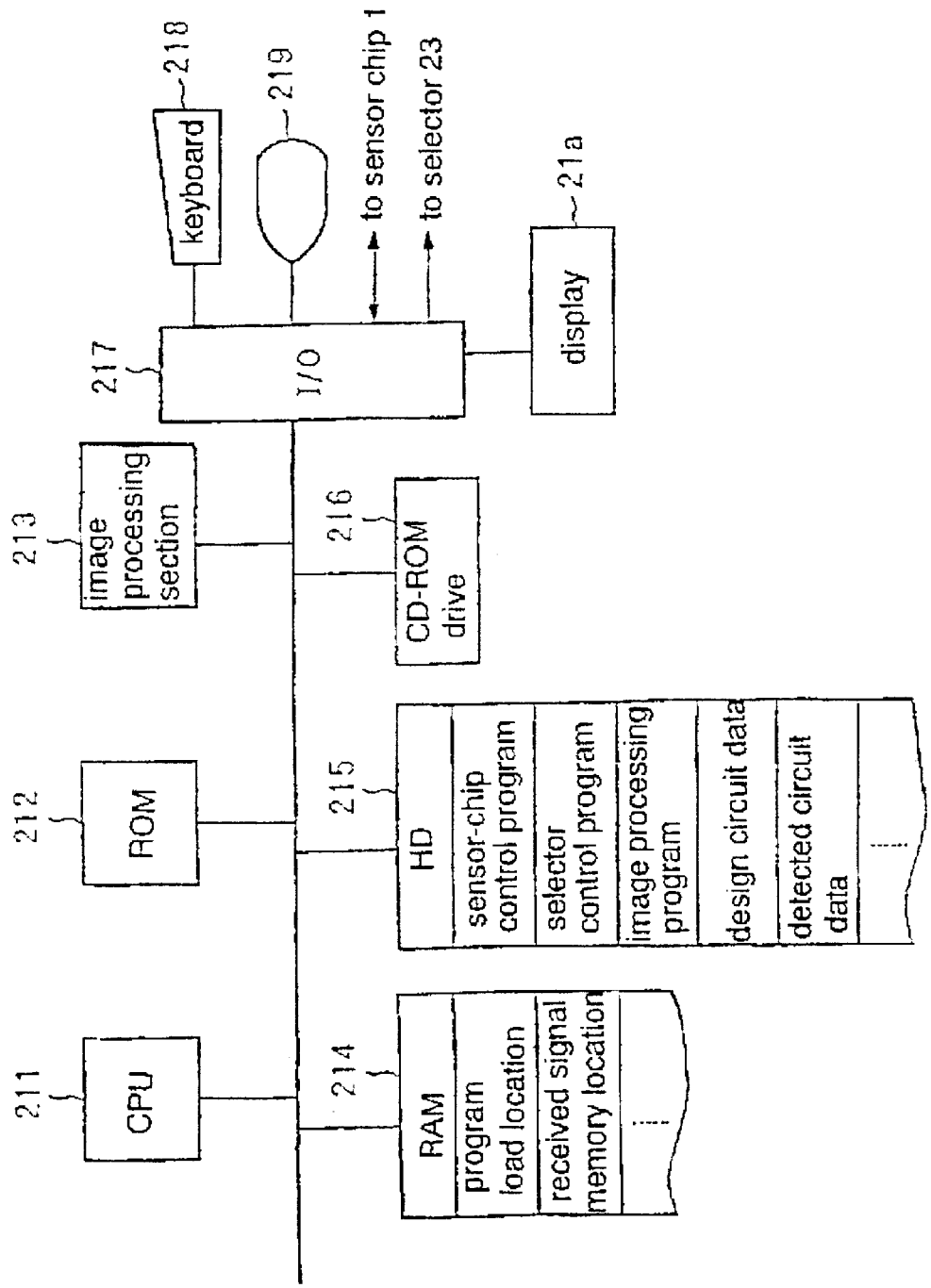
FIG. 3 is a schematic block diagram showing hardware of a computer in the inspection system according to the first embodiment of the present invention.

With reference to FIG. 3, the internal construction of the computer 21 will now be described. FIG. 3 is a schematic block diagram showing the hardware of the computer 21.

The reference number 211 indicates an arithmetic and control CPU for controlling the entire computer 21, the reference number 212 indicating a ROM for storing fixed values and various programs executed on the CPU 211, the reference number 213 indicating an image processing section for processing an input digital data to generate an image data and processing the image data to output on a display 21a, and the reference number 214 indicating a RAM as a backup memory including a program load location for storing the programs to be loaded and a memory location for storing the digital signals received from the sensor chip. The received digital signals are stored separately for each group of the sensor elements corresponding to each shape of the circuit wirings.

The reference number 215 indicates a hard disk (HD) as an external memory device. The reference number 216 indicates a CD-ROM drive as a read device for a detachable recording medium.

The reference number 217 indicates an input/output interface. The HD 215 communicates with a keyboard 218 and/or mouse 219 as an input device, the sensor chip 1 and the selector 23 through the input/output interface 217. The HD 215 stores a sensor-chip control program, selector control program and image processing program which will be loaded on the program load location of the RAM 214 and executed on the CPU. The image data representing the shape of the circuit wiring inspected by the sensor chip 1 and the design image data representing the shape of the design circuit wiring are also stored in the HD 215.

In order to use for desired determinations, the image data input from the sensor chip may be stored by the group of sensor elements opposed to each shape of circuit wirings, or by one frame of all of the sensor elements.

The sensor-chip control program, the selector control program, the image processing program and the design image data representing the shape of the design circuit wiring may be installed by reading a CD-ROM as the detachable recording medium through the use of the CD-ROM drive, or by reading another medium such as FD or DVD, or by downloading via networks.

Figure 4:
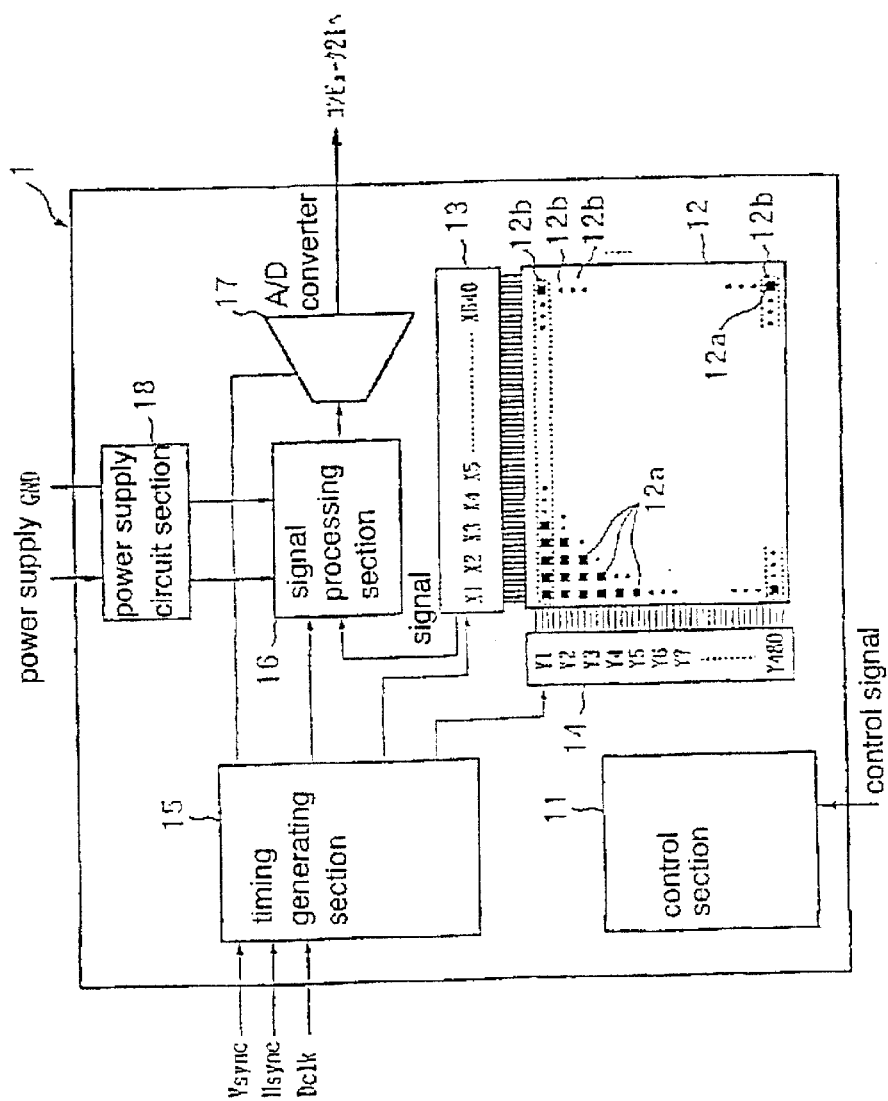
FIG. 4 is a block diagram showing an electrical construction of a sensor chip according to the first embodiment of the present invention.

FIG. 4 is al block diagram showing the electrical construction of the sensor chip 1. The sensor chip 1 has the electrical construction as shown in the figure and is mounted on a package (not shown).

The sensor chip 1 includes a control section 11, a sensor element set 12 composed of the plurality of sensor elements 12a, a vertical select section 14 for selecting sensor element lines 12b each composed of a given number of horizontally aligned sensor elements, a lateral select section 13 for picking up signals from the sensor elements 12a, a timing generating section 15 for generating a select signal for selecting each of the sensor element lines 12b, a signal processing section 16 for processing signals from the lateral select section 13, an A/D converter 17 for A/D converting signals from the signal processing section 16, and a power supply circuit section 18 for supplying electrical power for driving the sensor chip 1.

The control section 11 is provided for controlling the operation of the sensor chip 1 in accordance with the control signal from the computer 21. The control section 11 includes a control register to set the operation timing, amplification and reference voltage of the sensor, and the range or area of the sensor elements to be used for inspection. In case of simultaneously using a plurality of sensor chips, the control section may set sensor select numbers to allow each of the sensor chips to be distinguished by the host CPU.

The sensor elements 12a are arranged in a matrix form (480 elements for each column×640 elements for each row), and each of the sensor elements 12a detects in a non-contact manner the potential variation on the circuit wring 101 in response to the inspection signal supplied from the corresponding probe 22 to the circuit wring 101.

The timing generating section 15 is supplied with the vertical synchronizing signal (Vsync), horizontal synchronizing signal (Hsync) and digital clock signal (Dclk) from the computer 21 to supply a timing signal for selecting the sensor elements 12a to the vertical select section 14, lateral select section 13, signal processing section 16 and A/D converter 17.

The vertical select section 14 selects at least one row of the sensor element set 12 sequentially in accordance with the timing signal from the timing generating section 15. All of the detected signals of the sensor elements 12a in the sensor element line 12b selected by the vertical select section 14 are output at once from these sensor elements 12a and are input into the lateral select section 13. The lateral select section 13 amplifies the analog detected signals output from 640 pieces of terminals, and then temporarily holds the amplified signals. Then, the lateral select section 13 outputs the analog signals sequentially to the signal processing section 16 in accordance with the timing signal generated by a selecting circuit composed of a multiplexer or the like in the timing generating section 15.

The signal processing section 16 further amplifies the analog signals from the lateral select section 13 to the level required for a determination processing, and performs an analog signal conditioning such as filtering for canceling noise, followed by transferring these signals to the A/D converter 17. The signal processing section 16 also includes an automatic gain control to automatically arrange the voltage amplification factor of the signals read from the sensor elements to an optimum value.

The A/D converter 17 converts the detected signals, which are detected by each of the sensor elements and transmitted from the signal processing section 16 in an analog form into the digital signals, for example, of 8-bit, and then outputs these digital signals.

The power supply circuit 18 generates a reference clamp voltage for the signal processing section or the like.

While the A/D converter 17 is incorporated into the sensor chip 1 in this embodiment, the analog signals subjected to the analog signal conditioning in the signal processing section may be output directly to the computer 21.

Figure 5:
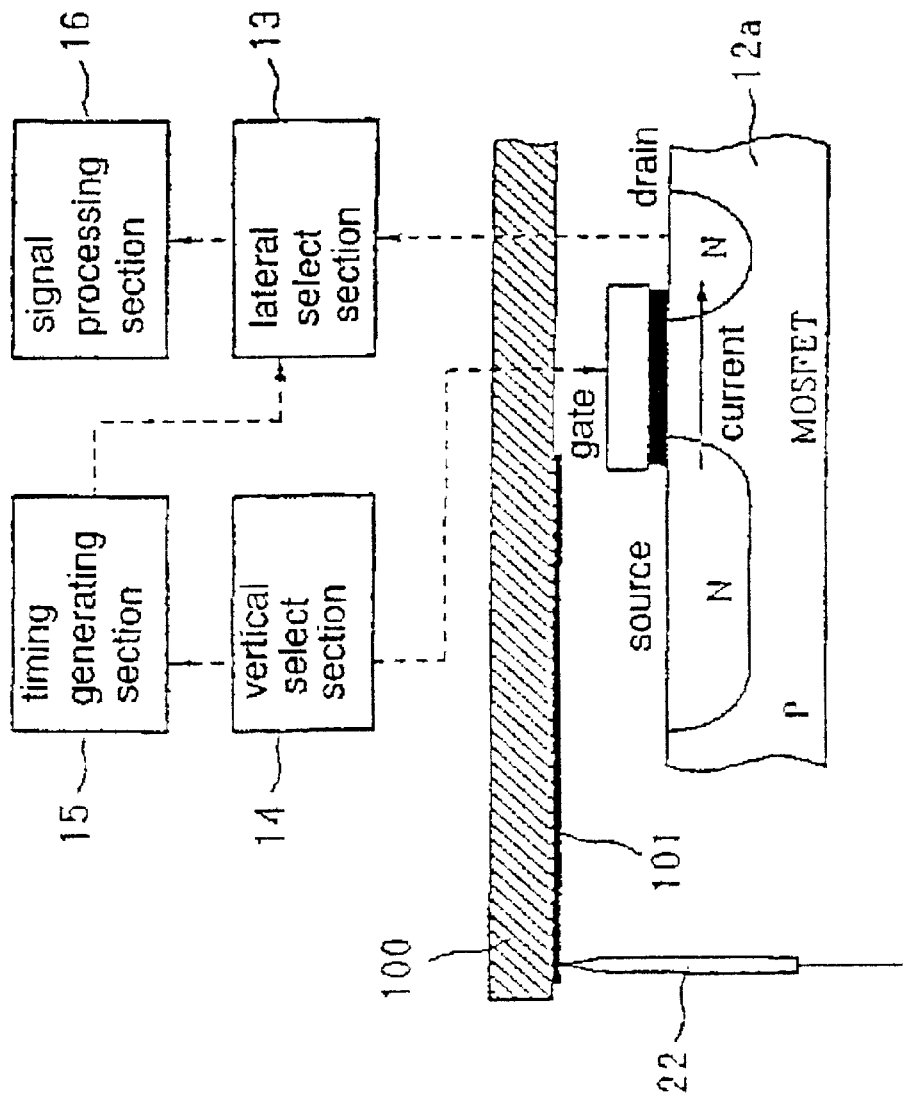
FIG. 5 is an explanatory block diagram of a sensor element according to the first embodiment of his invention.

The operation of the sensor elements 12a will now be described. FIG. 5 is an explanatory block diagram of one of the sensor elements 12a.

The sensor element 12a is a MOS field effect transistor (MOSFET), in which one of diffusion layers is formed to have a lager surface area than that of the other diffusion layer. The diffusion layer having the larger surface area serves as a passive element and is positioned opposed to the circuit wiring 101. The passive element is formed continuously with a source of the MOSFET. The MOSFET also has a gate connected to the vertical select section 14, and a drain connected to the lateral select section 13. The diffusion layer serving as the passive element is also provided with a discharge potential barrier for discharging an unwanted charge.

When the sensor element 12a is selected by the timing generating section 15 through the vertical select section 14, a signal is transmitted from the vertical select section 14 to the gate to turn on the sensor element 12a (i.e. to bring the sensor element 12a into a state ready to output the detected signal).

At this moment, when a given voltage is applied to the circuit wiring 101 from the probe 22 as an inspection signal, the potential of the circuit wiring 101 is varied and thereby a current flows from the source to the drain. This current serves as the detected signal which is transmitted to the signal processing section 16 through the lateral select section 13. If no circuit wiring 101 exists at the position opposed to the sensor element 12a, no current will flow.

Thus, by analyzing the position of the sensor element 12a having the output current as the detected signal, it can be determined which position in the circuit board 100 the circuit wiring 101 extending continuously from its electrode contacted with the probe 22 is located at.

Figure 6:
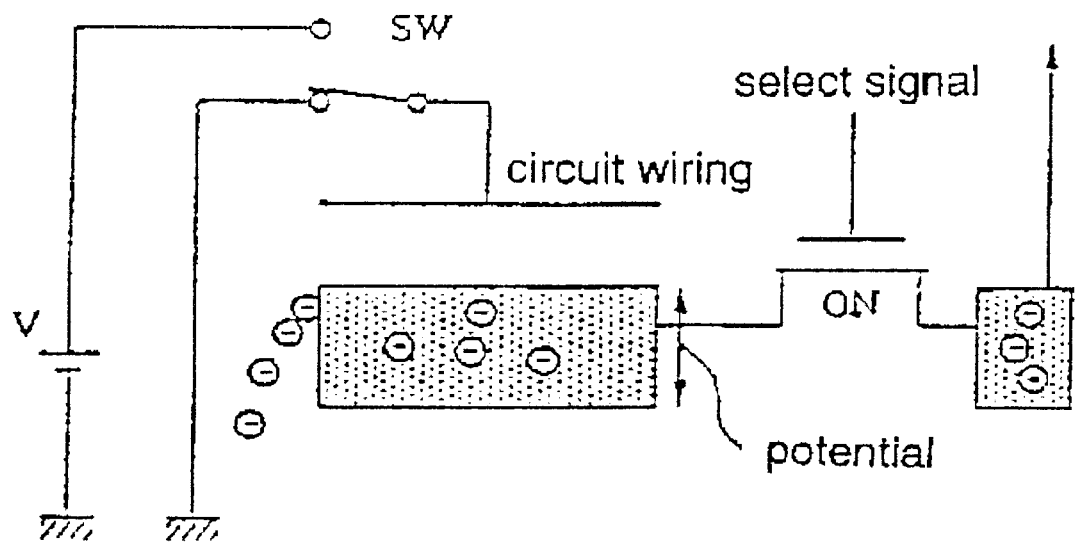
FIG. 6 is an explanatory model diagram of a principle on which a current is generated in response to a potential variation on a circuit wiring, in the sensor element according to the first embodiment of the present invention.
Figure 7:
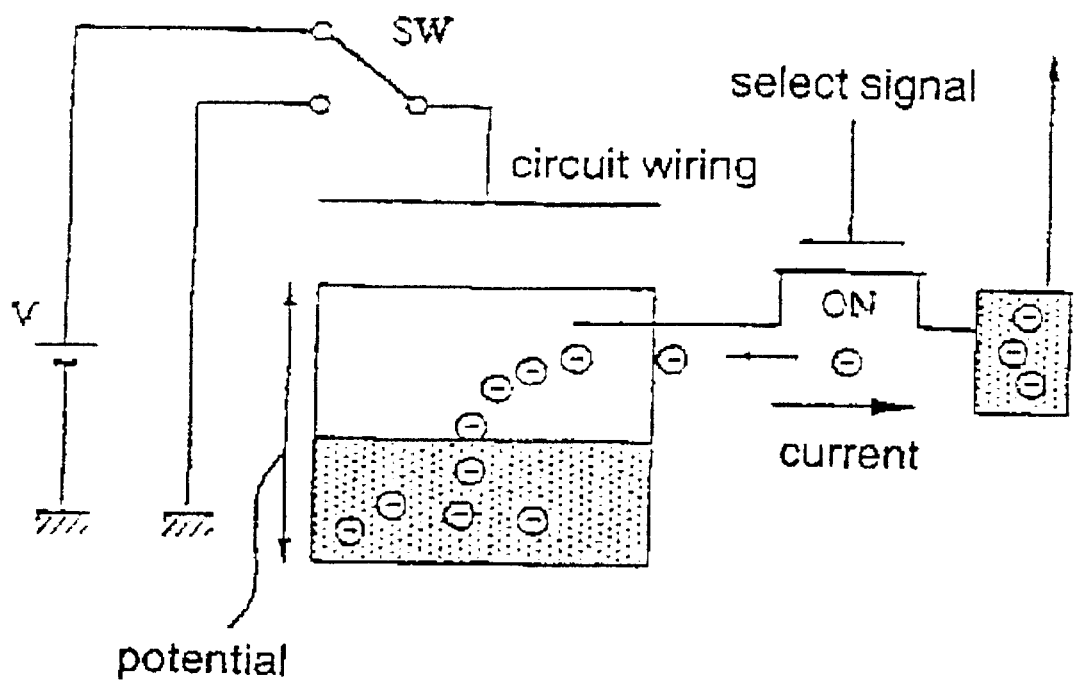
FIG. 7 is an explanatory model diagram of a principle on which a current is generated in response to a potential variation on a circuit wiring, in the sensor element according to the first embodiment of the present invention.

A principle on which a current flows from the source to the drain will now be described in detail. FIGS. 6 and 7 are model diagrams for explaining this principle simply. FIG. 6 shows the state when no voltage is applied to the circuit wiring and FIG. 7 shows the state when a given voltage is applied to the circuit wiring. Both of these figures are shown in the state when the select signal is input to the gate and thereby the gate is turned on.

As shown in FIG. 6, if no voltage is applied to the circuit wiring, a surplus charge in the diffusion layer flows over from the discharge potential barrier having a lower potential than that of a potential barrier below the gate which is turned off. In this case, the potential of the source is defined by the potential of the discharge potential barrier.

As shown in FIG. 7, when a voltage V is applied to the circuit wiring, the circuit wiring is positively charged (at a potential V). Since the circuit wiring and the source-side diffusion layer are distanced at very close range, the source-side diffusion layer has the increased potential V by the influence of the potential variation in the circuit wiring, and thereby a charge flows into the source-side diffusion layer. That is to say, the source-side diffusion layer operates as if the circuit wiring and the source-side diffusion layer were capacitively coupled, so that the potential at the source-side diffusion layer is lowered to allow electrons to flow into the source-side diffusion layer or allow a current to flow from the source to the drain.

When the circuit wiring is connected to the ground again, the source-side diffusion layer gets back into the original potential, and thereby surplus electrons are released gradually from the discharge potential barrier.

Signal Input/output Timings in Sensor Chip

Figure 8:
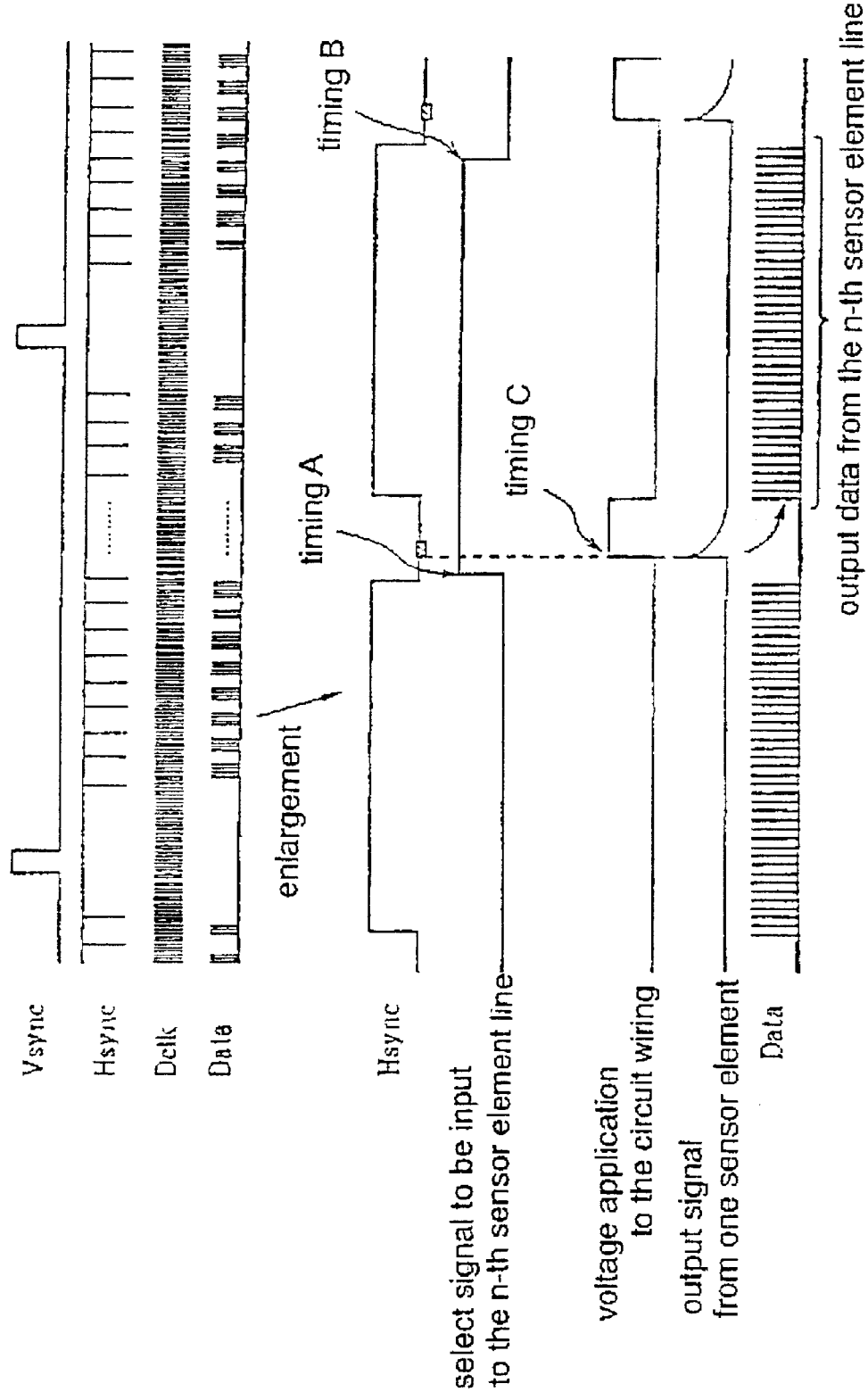
FIG. 8 is a timing chart showing input/output timings in the sensor chip according to the first embodiment of the present invention.

FIG. 8 is a timing chart showing input/output timings in the case of using a MOSFET as shown in FIG. 5.

The upper four lines show the Vsync, the Hsync, the Dclk and the output data from the sensor chip 1, respectively. The lower six lines show several enlarged Hsyncs and each of input/output signals in the sensor element generated during the course of these Hsyncs, respectively.

When the Vsync, Hsync and Dclk are input to the timing generating section 15 as shown in this figure, the illustrated data will be output from the sensor chip 1.

More specifically, the timing generating section 15 starts counting the Dclk from the trailing edge of the n-th Hsync to control for the vertical select section 14 to transmit the select signal to the n-th sensor element line 12b at a given timing A. Then, the vertical select section 14 further counts the Dclk to keep transmitting the select signal until a given timing B.

On the other hand, the computer 21 starts counting the Dclk from the trailing edge of the n-th Hsync to control for the selector 23 to apply the given voltage to the circuit wiring to be inspected, i.e. inspection circuit wiring, at a timing C which lies between the timings A and B.

The timing generating section 15 also controls for the lateral select section 13 to hold the detected signals from the n-th sensor element line at the same timing as the timing C. The reason why this timing is set in the same as the timing C is that in case of using the MOSFET as shown in FIG. 5, the output from each of the sensor elements appears as an exponentially reducing current having a differential waveform of the voltage pulse applied to the circuit wiring.

Figure 9:
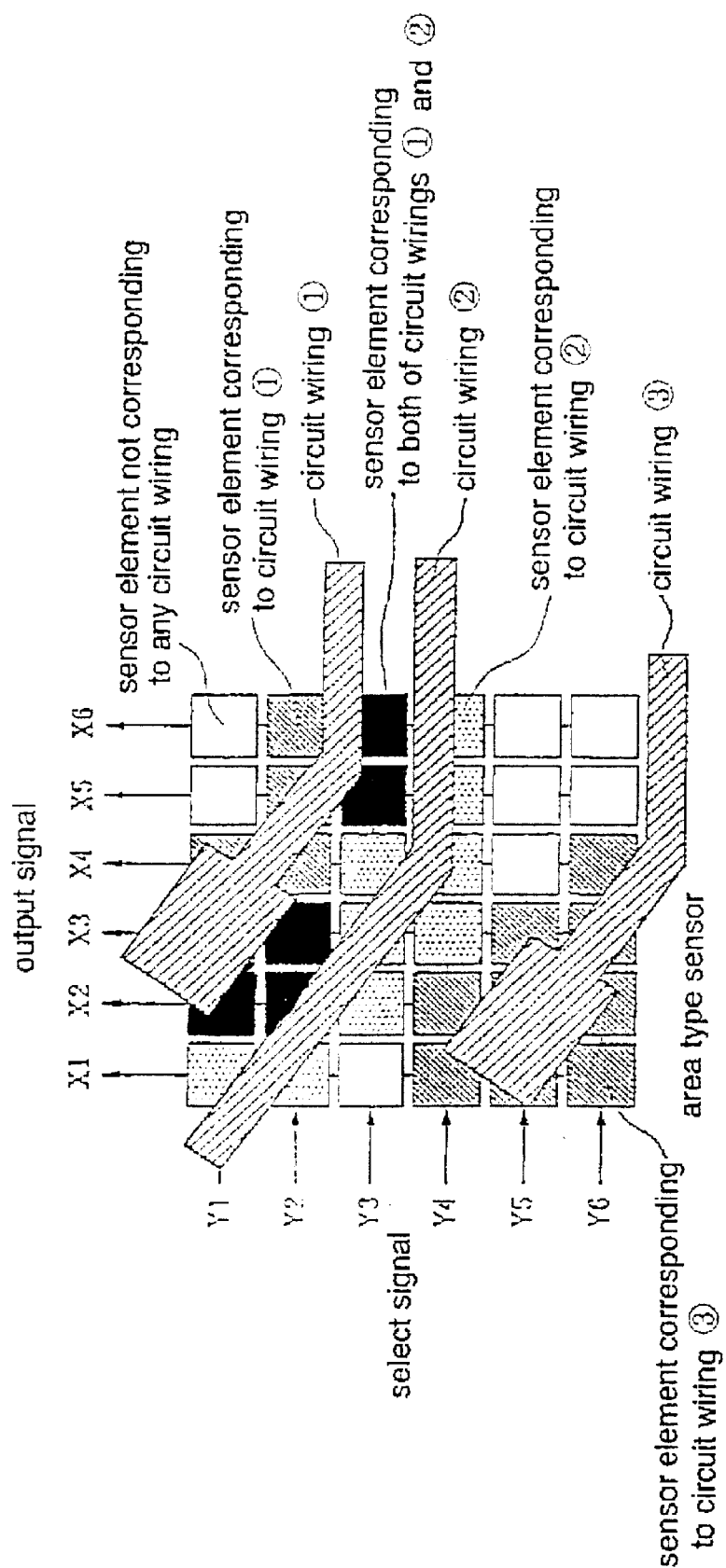
FIG. 9 is an explanatory diagram of an inspection of circuit wirings ① to ③ by using 6×6 sensor elements, in the inspection system according to the first embodiment of this invention.
Figure 10:
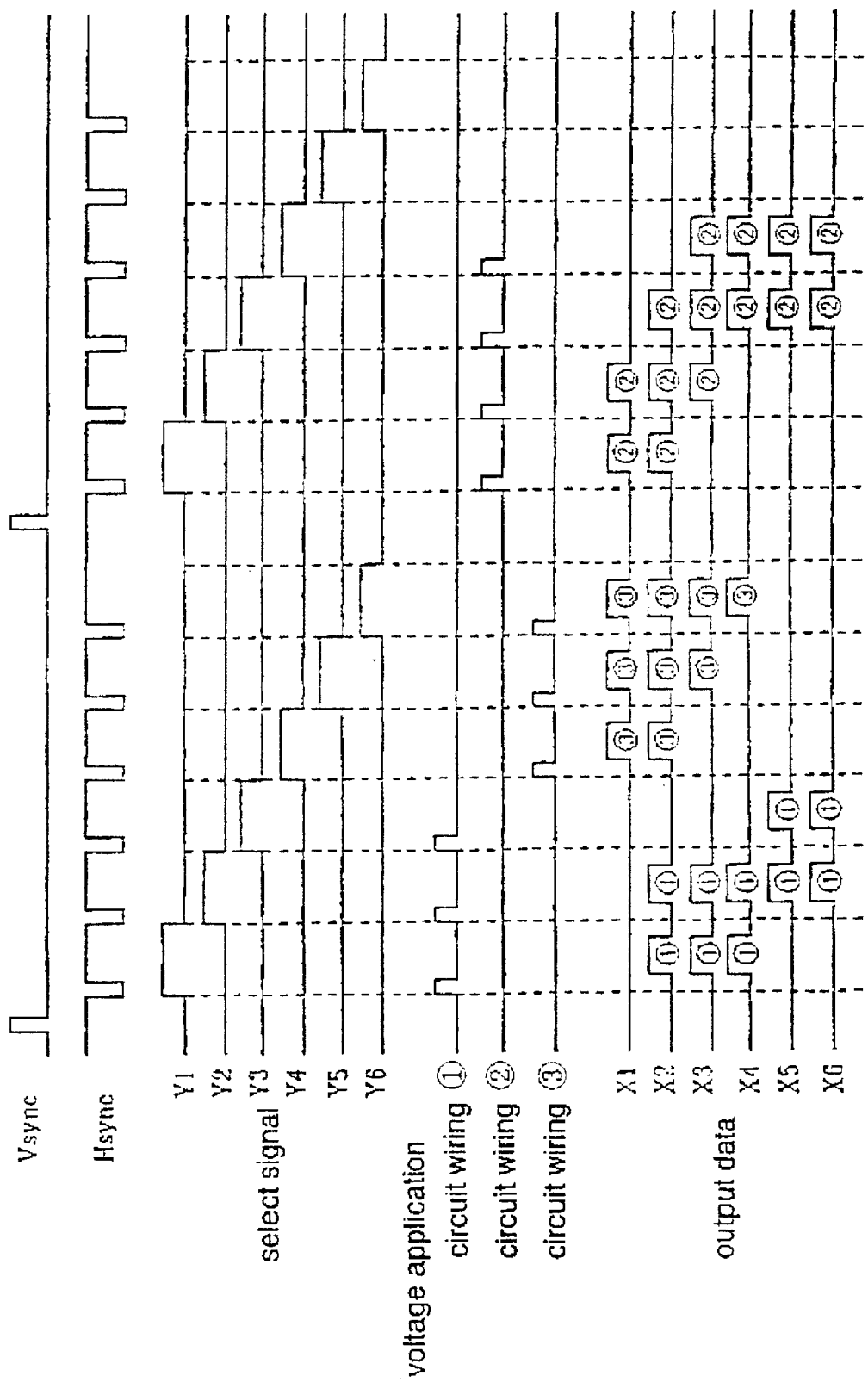
FIG. 10 is a timing chart showing voltage applying timings to the circuit wirings shown in FIG. 9 and data output timings.

With reference to FIGS. 9 and 10, each voltage applying timing to three circuit wirings and each corresponding output signal will be specifically described.

FIG. 9 is an explanatory diagram of an inspection of the circuit wirings ① to ③ by use of 6×6 sensor elements.

As the sensor elements corresponding to the circuit wiring ①, there are 10 sensor elements which are positioned at the coordinates (X2, Y1), (X3, Y1), (X4, Y1), (X2, Y2), (X3, Y2), (X4, Y2), (X5, Y2), (X6, Y2), (X5, Y3) and (X6, Y3).

As the sensor elements corresponding to the circuit wiring ②, there are 14 sensor elements which are positioned at the coordinates (X1, Y1), (X2, Y1), (X1, Y2), (X2, Y2), (X3, Y2), (X2, Y3), (X3, Y3), (X4, Y3), (X5, Y3), (X6, Y3), (X3, Y4), (X4, Y4), (X5, Y4), and (X6, Y4).

As the sensor elements corresponding to the circuit wiring ③, there are 9 sensor elements positioned at the coordinates (X1, Y4), (X2, Y4), (X1, Y5), (X2, Y5), (X3, Y5), (X1, Y6), (X2, Y6), (X3, Y6), and (X4, Y6).

Among these sensor elements, the 5 sensor elements at the coordinates (X2, Y1), (X2, Y2), (X3, Y2), (X5, Y3) and (X6, Y3) illustrated by black color are used for both inspections of the circuit wirings ① and ②. Thus, both of the circuit wirings ① and ② cannot be inspected simultaneously by driving the sensor elements only one time. In addition, both of the circuit wirings ② and ③ are inspected by using the sensor elements on the sensor element line of the coordinate Y4. Thus, when using the above process in which one row of the sensor element line is simultaneously driven, both of the circuit wirings ② and ③ cannot be inspected simultaneously by driving the sensor elements only one time. On the other hand, such a problem will not be caused between the circuit wirings ① and ③.

Consequently, both of the circuit wirings ① and ③ are first inspected during all of the sensor elements are driven (one frame), and then the circuit wiring ② is inspected in a subsequent frame.

Accordingly, the timing chart will become as shown in FIG. 10, wherein the data representing the shape of the circuit wiring ①, the data representing the shape of the circuit wiring ③, and the data representing the shape of the circuit wiring ② will be output sequentially.

Process of Applying Voltage to Plural Circuit Wirings

Figure 1:
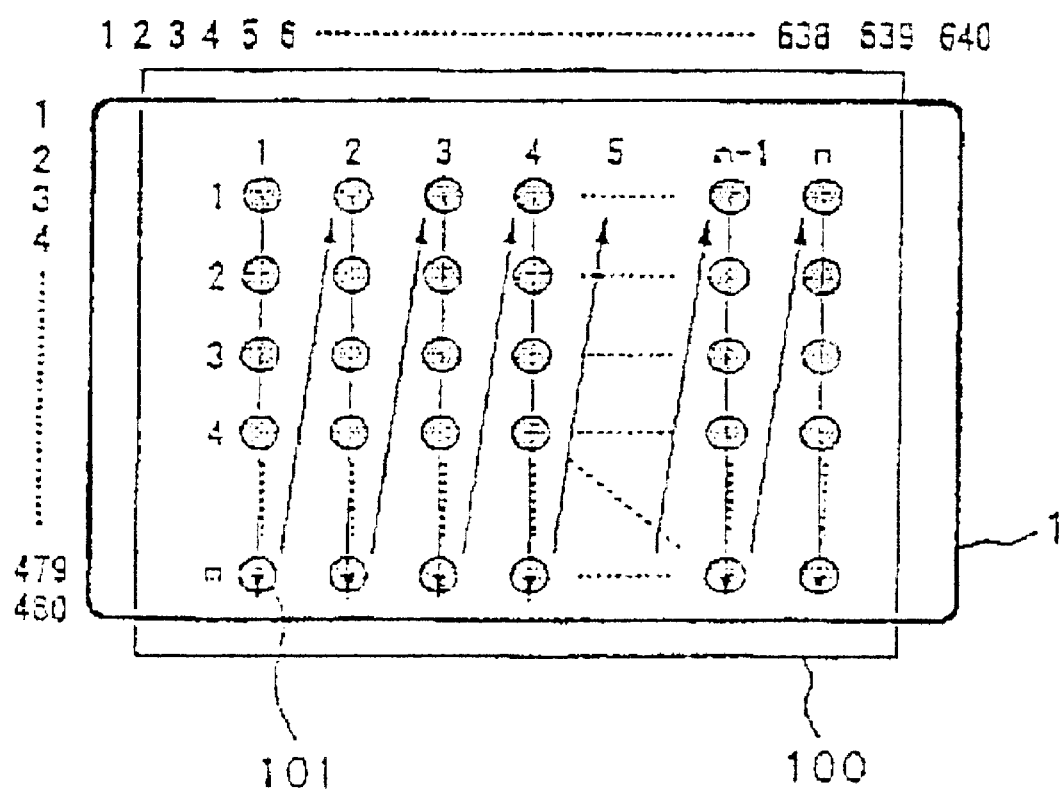
FIG. 1 is an explanatory diagram of a sequence for applying a voltage to a plurality of circuit wirings provided in one circuit board, in an inspection system according to a first embodiment of the present invention.
Figure 11:
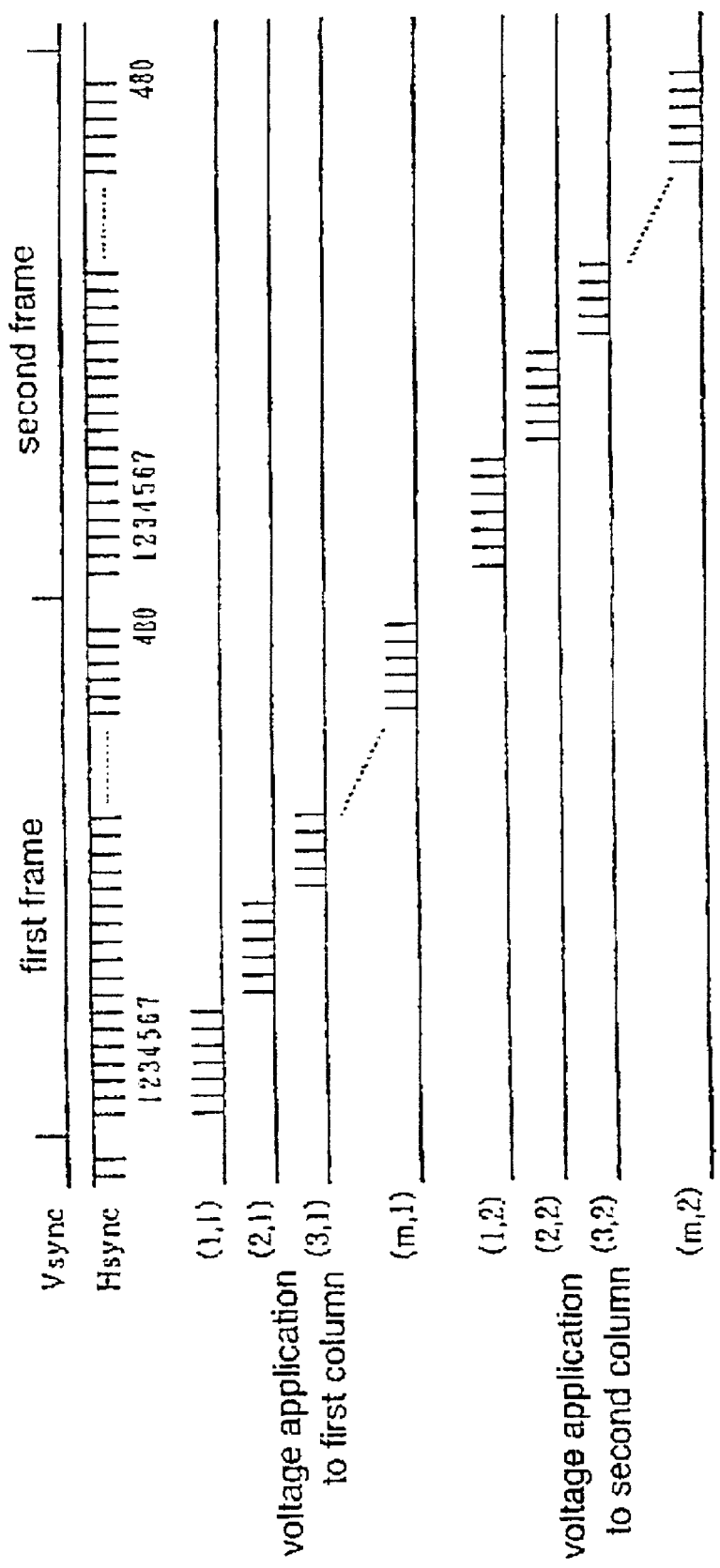
FIG. 11 is an exemplary timing chart of voltage applying timings to the circuit wirings in FIG. 1.

With reference to FIGS. 1 and 11, a process of applying a voltage efficiently to a plurality of circuit wirings will now be described.

FIG. 1 is an explanatory diagram of a sequence for applying a voltage to a plurality of circuit wirings provided in one circuit board. For simplifying explanation, each of the inspection circuit wirings is shown by ○ in FIG. 1. The circuit wirings are generalized as a model arranged in a matrix form having m rows and n columns. A signal receiving region of the sensor chip, or a sensor, is disposed to covers the plurality of circuit wirings.

Basically, during applying a voltage to one of plural circuit wirings covered by the signal receiving region of the sensor, it is necessary to keep any other circuit wirings in a reference potential (GND). When the voltage is applied simultaneously to two circuit wirings, even if one of the inspected circuit wirings includes a disconnection in the middle thereof, this circuit wiring having the disconnection is short-circuited to the other circuit wiring simultaneously supplied with the voltage, and thereby the voltage is applied from the other circuit wiring to the end or output side of the circuit wiring having the disconnection. As a result, the inspected circuit board will be improperly determined as an acceptable one, and the open or disconnection defect in the circuit wiring will be undesirably passed over. This is the reason of the above necessity.

When a voltage is supplied to the circuit wiring once during driving one of the sensor element lines, even if plural circuit wirings correspond to the same sensor element line, it is permitted to supply the voltage only to one of the circuit wirings.

Thus, as shown in FIG. 1, in the first frame, the voltage is applied to the circuit wirings aligned in the first column sequentially in the vertical direction of the figure from above, or in order the first row, the second row, - - - , and the m-th row. In the second frame, the voltage is also applied to the circuit wirings arranged in the second column sequentially in the vertical direction of the figure from above. Thus, in the n-th frame, all of the circuit wirings will be applied with the voltage.

FIG. 11 is an exemplary timing chart of timings for applying the voltage to the circuit wirings shown in FIG. 1.

As shown in this figure, in response to each of the first Hsync to seventh Hsync in the first frame (in the interval from the first Vsync to second Vsync), the voltage is applied to the circuit wiring arranged in the first row and the first column or (1, 1). Then, in response to each of the eighth Hsync to the fourteenth Hsync, the voltage is applied to the circuit wiring arranged in the second row and the first column or (2, 1). The voltage is further applied sequentially to the circuit wirings (3, 1), (4, 1), . . . ,(m, 1). Then, shifting to the second frame, the voltage is applied sequentially to the circuit wirings (1, 2), (2, 2), . . . ,(m, 2). Thus, the sensor elements are driven repeatedly until the entire circuit wirings are completely inspected, or until the inspection in the n-th frame are completed.

Modeling of Circuit Wirings

With reference to FIGS. 12 and 13, a process of modeling the circuit wirings in the matrix form as described above will now be described.

A region of the inspection circuit wiring is cut out in a rectangular shape from the shape data (e.g. CAD data) of the design circuit wirings to produce a table as shown in FIG. 12. In FIG. 12, each of the individual circuit wirings is uniquely numbered, and the uppermost and leftmost coordinate and the bottommost and rightmost coordinate of the rectangular region including each of the numbered circuit wirings are associated with the coordinates of the sensor element to indicate them on this table. The first frame is first selected for all of the numbered circuit wirings.

Then, the numbered circuit wirings are rearranged in order of smaller value in the upper left Y-coordinate. In FIG. 12, the first is the circuit wirings ① and ② each having the Y-coordinate Y1, and the second is the circuit wiring ③ having the Y-coordinate Y4.

Then, the upper left Y-coordinate value of each of the numbered circuit wirings is compared with the bottom right Y-coordinate value of each immediately preceding circuit wiring. When the former is smaller than the latter, the frame of the former is shifted to another one on the assumption that the sensor element lines for reading these circuit wirings are overlapping.

In FIG. 12, the circuit wiring ① is defined as a circuit wiring to which the voltage is first applied. Then, the upper left Y-coordinate of the circuit wiring ② is compared with the bottom right Y-coordinate of the circuit wiring ①. In this case, the bottom right Y-coordinate of the circuit wiring ① is Y3 and the upper left Y-coordinate of the circuit wiring ② is Y1, and Y3 is larger than Y1. Thus, the circuit wiring ② is shifted to the second frame. Since the second frame is inspected after the first frame, the circuit wiring ② is transferred to the lowest line of the table.

At this moment, the circuit wiring immediately preceding to the circuit wiring ③ is the circuit wiring ①. Then, the upper left Y-coordinate Y4 of the circuit wiring ③ is compared with the bottom right Y-coordinate Y3 of the circuit wiring ①. Since Y4 is greater than Y3, the circuit wiring ③ remains in the first frame. Repeating the same steps, each frame for the circuit wiring ④ and all other circuit wirings will be defined as either one of the first and second frames. Through the above steps, each of the circuit wirings is grouped into either one of the first frame and the second frame.

The same steps are carried out in the group of the second frame. In this case, the upper left Y-coordinate value of the circuit wiring is compared with the bottom right Y-coordinate value of the immediately preceding circuit wiring to which the voltage is applied. Then, when the former is less than the latter, the circuit wiring having the less value is shifted to the third frame. If not, the circuit wiring having the greater value is left in the second frame.

Through the above steps, the first, second and third frames are grouped. These steps are carried out as long as additional frame is required. When no additional frame is required, this process will be completed.

As a result of the above process, the table as shown in FIG. 13 is produced. In this table, the frame numbers correspond to the column numbers shown in FIG. 1, and the numbers representing the sequence for applying a voltage to the circuit wirings within the same frame correspond to the row numbers shown in FIG. 1.

Referring to FIG. 13, in response to the first to third Hsyncs (cf. Y-coordinate) after the first Vsync, a voltage pulse is first applied to the circuit wiring ①, and then in response to the fourth to sixth Hsyncs, a voltage pulse is applied to the circuit wiring ③. Further, in response to the first to fourth Hsyncs after the second Vsync, a voltage pulse is applied to the circuit wiring ②.

In the above process, on the assumption that the shape data of the design circuit wiring completely corresponds to the coordinates of the sensor elements, the profile coordinates of the circuit wiring is simply defined as the coordinates of the sensor elements. However, some displacement is actually cased by mechanical superposition between the sensor and the circuit wiring. Thus, the above Y-coordinate for determining the region to be inspected may be set to provide a slightly wider region in consideration with the above displacement.

Process for Image Processing

Figure 14:
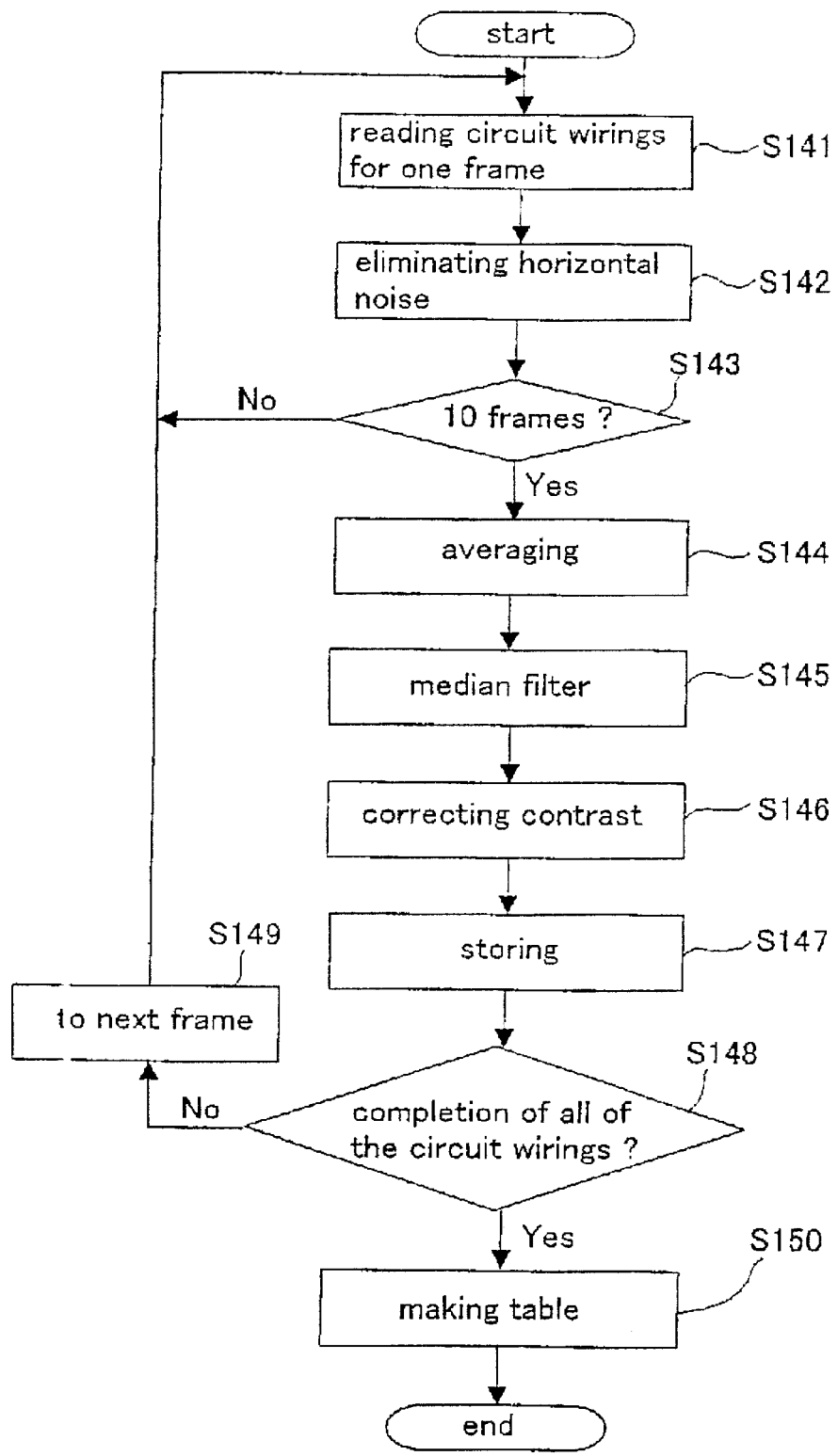
FIG. 14 is a flow chart showing a processing for extracting a target data from a gold sample in the inspection system according to the first embodiment of the present invention.
Figure 15:
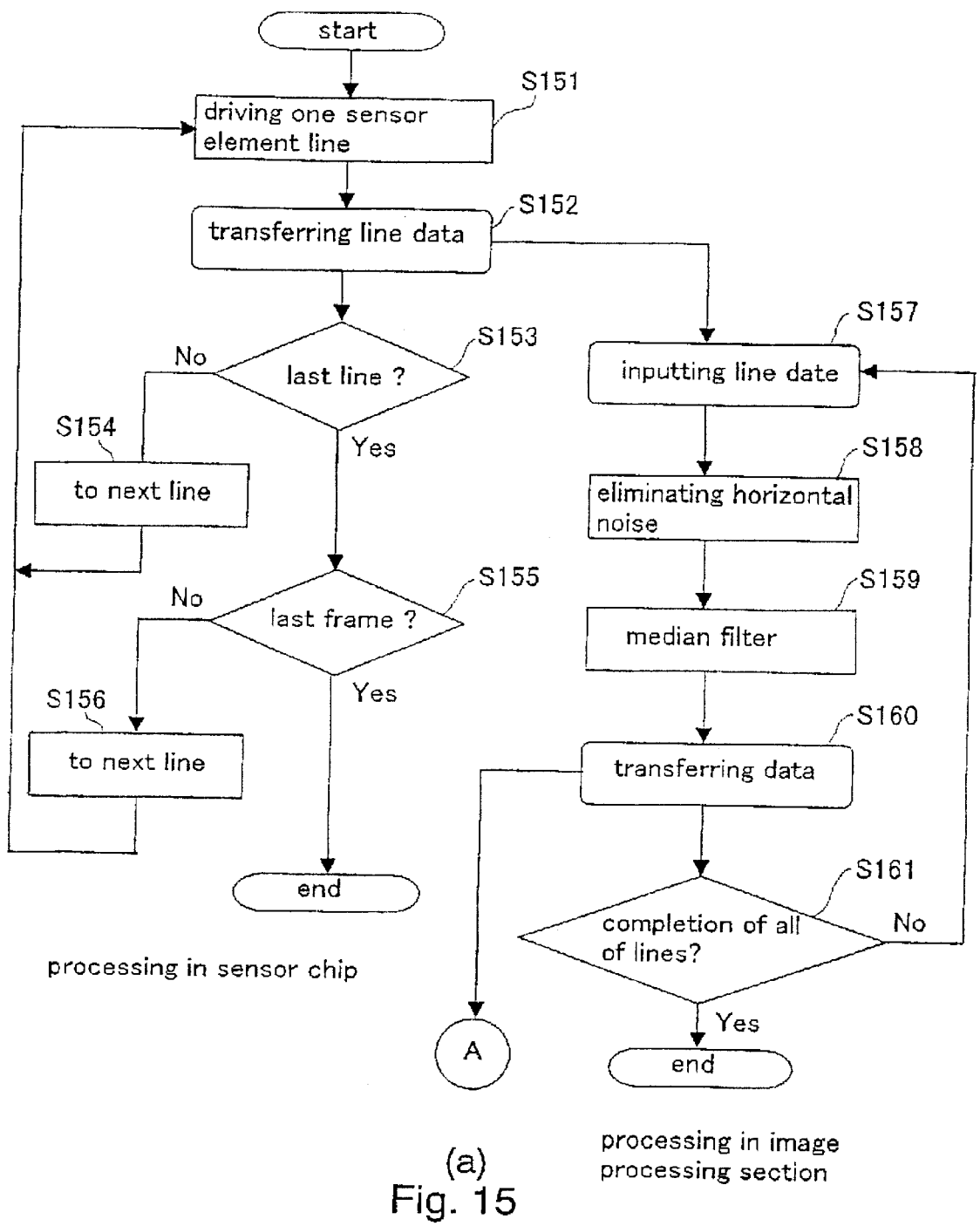
FIG. 15 is an explanatory flow chart of an image processing in the inspection system according to the first embodiment of the present invention.

With reference to FIGS. 14 and 15, it will now be described how to handle the image data in the inspection system of the present invention.

It will be first described how to extract a target data before starting the inspection.

FIG. 14 is a flow chart showing a processing for extracting the target data from a gold sample.

At the step S141, on a circuit board of the gold sample, circuit wirings in one frame are inspected. Specifically, all of sensor elements are driven to pick up a digital data representing each shape of plural circuit wirings which can be made in a model arranged in one column.

At the step S142, horizontal noise is eliminated. This is performed by horizontally averaging the data corresponding to 10 dots on the left edge of the picked-up image and subtracting the averaged value from the value of the original entire image data.

At the step S143, it is determined whether the reading for 10 frames has been completed. If not, the process returns to the step S141 to inspect the same circuit wiring again. When the inspection for 10 frames is completed, the process will proceed to the step S144.

At the step S144, the image data for 10 frames is averaged. Then, at the step S145, the averaged data is passed through a median filter. By this processing, local noise is eliminated.

Then, after correcting contrast at the step S146, the profile data is stored in the RAM 214 of the computer 21 as the target data at the step S147.

At step S147, it is determined whether the digital data for all of the circuit wirings on the gold sample has been picked up. If there remain some un-inspected circuit wirings, the process proceeds to the step S149 and the processing from the step S141 to the step S147 in the next frame is carried out to the remained circuit wirings. By repeating this processing, the image data for all of the circuit wirings will be picked up.

When the image data for all of the circuit wirings has been picked up, the process proceeds to the step S150 to make a table. In this table, each of the circuit wirings is associated with the range and the gradation thereof. The processing for extracting the target data is completed by producing the table.

A data processing flow in an actual inspection of a circuit board as a subject to be inspected will now be described.

FIG. 15 is an explanatory flow chart of an image processing in an inspection system according to one embodiment of the present invention.

At the step S151, one sensor element line is first driven. Then, at the step S152, the obtained digital data is transmitted with respect to each line to the image processing section 213 of the computer 21. At the step S153, it is determined whether the transmitted line is the last line in the related frame. If not, the next line is driven at the step S154. If determined as the last line, it is determined whether the frame is the last frame at the step S155. If not, the sensor element line for the next frame is driven at the step S156. If determined as the last frame, the operation of the sensor chip 1 is completed.

At the step 157, the digital data for one line is input into the computer 21. Then, at the step S156, horizontal noise is eliminated. This process is the same as that at the step S142 in FIG. 14. However, after eliminating the noise, the digital data is passed through a median filter in step S159 without the processing for averaging 10 frames as in the steps S143 and S144 in FIG. 14, and stored in the RAM 214 of the computer 21 at the step S160.

Then, at the step S161, it is determined whether all of the lines in all of the frames have been stored in the RAM 214. If all of the lines have not been transmitted, the process returns to the step S157 and repeats the steps S157 to S161.

At the step S161, if determined that all of lines in all of frames have been processed, the operation in the image processing section 213 is completed.

At the step S162, the data which has been processed by the image processing section 213 are input and stored in the RAM 214. Then, at the step S163, it is determined whether the data for one frame has been stored in the RAM 214. If determined that the data for one frame has been stored, the entire image data is passed through a median filter at the step S164. At the step S165, the filtered data is corrected in contrast. At the step S166, the data is binarized, and then the profile of the subject is traced.

The process further proceeds to the step S167, by using the least squares method, the image data are compared with the target data obtained by the processing shown in FIG. 14. At the step S168, the correlation value of the above two data is obtained to determine the acceptability of the subject. Then, at the step S169, the result of the acceptability is indicated on the display 21a. The target data in the frame as object of the inspection are read out in advance at the step S171 in the form of a parallel processing.

By going through the step S170, these steps S162 to S169 are repeated until the results for all of the frames are displayed. When all of the frames have been compared with the target data thereof and the results for all of frames have been displayed, the inspection of one circuit board is completed.

Generally, it takes time to trace the profile. Thus, the actual field radiation image data may be simply compared with that of the target data without tracing the profile. In this case, the criterion for determining the acceptability may be arranged such that if the tone value (gradient) of the actual image data lies within a given tonal range with respect to the image data extracted from the gold sample, the subject is acceptable.

As described above, the acceptability is determined in accordance with image data in this embodiment. This can provide an accurate determination of the acceptability. Further, since the result is displayed as images, each shape of the circuit wirings can be intuitively recognized and defective portions can also be readily detected. Furthermore, even if plural circuit wirings are provided on one circuit board, all of the circuit wirings can be accurately and efficiently inspected by controlling the inspection sequence.

While each sensor element 12a is two-dimensionally arranged in conformity with the configuration of the circuit board 100 in the sensor chip 1, any three-dimensional arrangement may also be used.

Preferably, each shape of the sensor elements 12a is uniformly formed as shown in FIG. 3. This is intended to allow each sensor element 12a to supply the inspection signal to the circuit wiring and receive the signal appearing in the circuit wiring without any deviation.

As shown in FIG. 3, respective sensor elements 12a is preferably arranged at an even interval in the row and column directions, i.e. in a matrix form. This makes it possible to reduce the unevenness in the number of the sensor elements 12a per a unit area opposed to the circuit wirings and to clarify the relative physical relationship between the respective sensor elements 12a so as to readily specify each shape of the circuit wirings based on the detected signals. However, depending on the shape of the inspection circuit wirings, the sensor elements may also be arranged only in a single column.

In the above sensor chip 1, the sensor elements 12a are arranged in 480 rows×640 columns. However, this has been expediently selected for this embodiment, and the sensor elements in the range of 200,000 to 2,000,000 may be arranged in every area of 5 $\mu m^2$. In order to achieve an accurate inspection, it is preferable to set the size of each sensor element 12a and the space between the adjacent sensor elements in accordance with the line width of the circuit wiring.

While the N-channel MOSFET is used as the sensor element herein, the present invention is not limited to this construction, and the P-channel MOSFET may also be applied. Further, while the passive element is formed as the n-type diffusion layer herein, the present invention is not limited to this construction, and any material having relatively high conductivity, including amorphous semiconductors having such conductivity, may be applied. Furthermore, a conductor plate may be provided on the source-side diffusion layer serving as the passive element to define an ohmic contact thereto. This allows the conductivity in the surface of the passive element to be increased. Thus, a signal charge may be concentrated in the vicinity of the surface of the passive element to increase the density of the signal charge, which provides stronger capacitive coupling. In this case, the conductor plate may be formed of either a metallic film or a polycrystalline semiconductor.

A charge-voltage conversion circuit in which a diffusion layer of the semiconductor serves as an element for receiving signals from a circuit wiring may be used as the sensor element. In this case, the detected signal may be picked up in the form of an amplified voltage so as to discriminate the detected signal more clearly. This allows the inspection of the circuit board to be performed with a higher degree of accuracy.

A Bipolar transistor may also be used as the sensor element to output the detected signals accurately at a high speed. A thin-film transistor may also be used as the sensor element to increase the productivity of the sensor element and to increase the array area of the sensor elements.

Additionally, a charge transfer element may be used as the sensor element. The charge transfer element may include a CCD. In this case, a charge-readout MOSFET may be used as the transistor. Then, the passive element may be formed continuously with a diffusion layer serving as a source of the charge-readout MOSFET, and the select signal may be input into a gate of the charge-readout MOSFET to lower a potential barrier formed below the gate. Further, a signal charge residing in the source may be transferred to a drain of the charge-readout MOSFET as a charge for the detected signal, and then the detected signal may be transferred by the charge-transfer element connected to the drain.

Furthermore, a charge-supply MOSFET for supplying a charge to the passive element in response to the potential variation in the conductive pattern and forming a potential barrier not to cause the backflow of the supplied charge before completing the potential variation in the conductive pattern may be provided, and a drain of the charge-supply MOSFET may be formed continuously with the diffusion layer serving as the passive element to provide a stable charge transfer. Using the charge-transfer element will also eliminate the need for providing a switching circuit, such as a multiplexer, to the lateral select section.

The sensor elements may be provided on a board of any material other than conductive materials, such as glass, ceramics, glass epoxy or plastics, and formed of any material capable of receiving electromagnetic waves radiated from the circuit wiring applied with the inspection signal, such as a material having a relatively high conductivity, metallic film, polycrystalline semiconductor, or an amorphous semiconductor.

While this embodiment is arranged to detect the voltage variation in the circuit board, it may also be arranged to detect the magnitude of the electro-magnetic waves radiated from the circuit wiring and the radiation shape thereof. If a given magnitude and shape of the electromagnetic waves are detected, it will be determined that the continuity of the circuit wiring is normally. If a lower magnitude and a different shape of the electromagnetic waves with respect to a given criterion are detected, it will be determined that the circuit wiring has some disconnected portion or chipped portion.

Further, while this embodiment is arranged to bring the probe into contact with the end of the circuit wiring, a non-contact terminal may also be used to input the inspection signal from the starting point of the circuit wiring. The sensor chip may be a line-type sensor in which the sensor elements are arranged in one line. In this case, a given region of the circuit wirings may be inspected by moving the sensor chip vertically. When the inspected circuit wirings on the circuit board is larger than the array of the sensor elements, an area-type sensor may also be used and mechanically moved.

When the shape of the circuit wirings is considerably run off the edge of the signal receiving region of the sensor, each data received at different positions of the sensor elements may be saved and then combined.

While this embodiment is arranged to simultaneously drive one sensor element line, the present invention is not limited to this manner, and a plurality of sensor element lines or a plurality of sensor elements in an area shape or non-line shape may be simultaneously driven. In such cases, if a plurality of sensor element groups opposing to the shape of the inspection circuit wiring are overlapped with a part of the sensor element groups opposing to the shape of another circuit wiring, the timing for applying a voltage to said another circuit wiring is also set in a selected period in a different frame.

Second Embodiment

Figure 16:
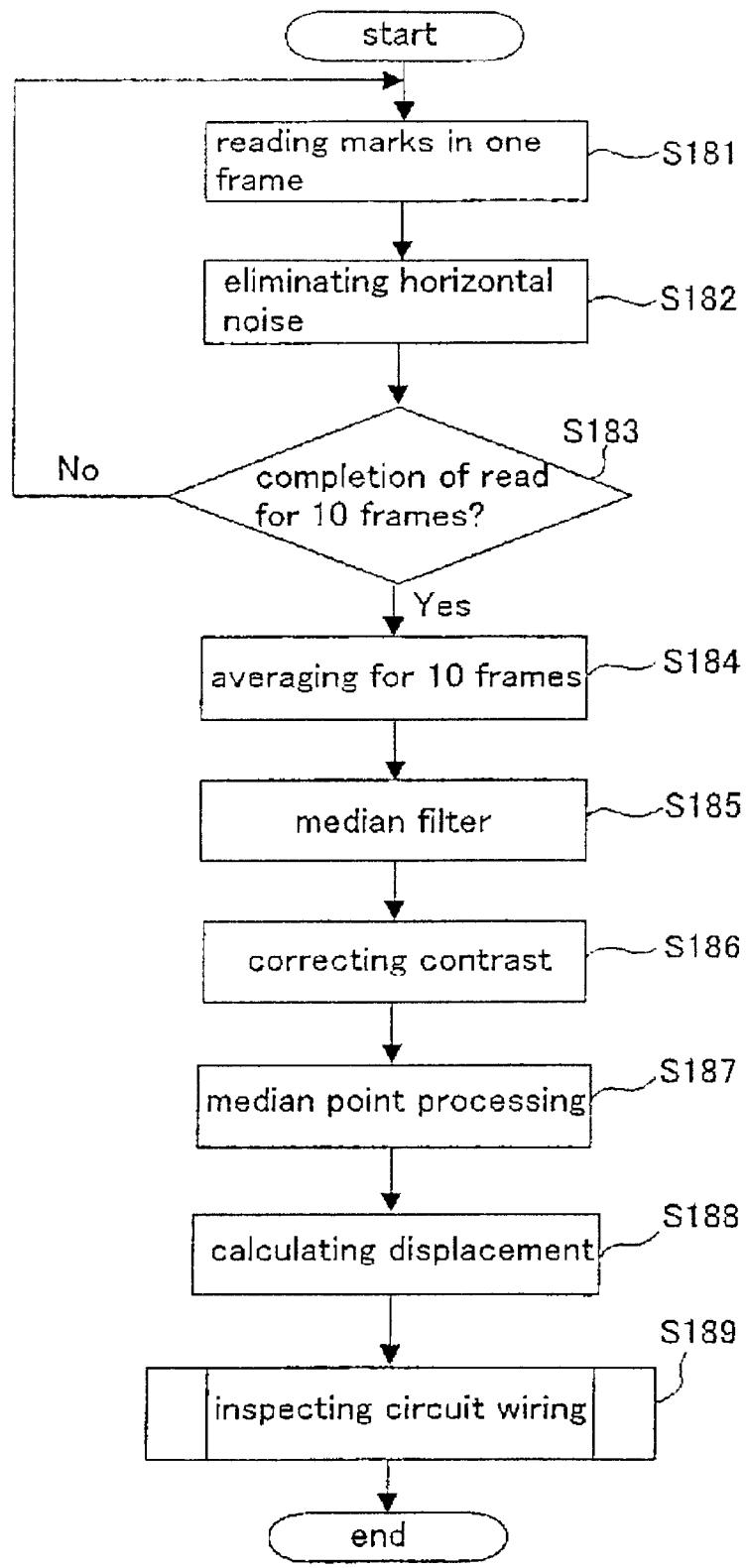
FIG. 16 is a flow chart showing a processing for determining displacement from a CAD data, in an inspection system according to a second embodiment of the present invention.

With reference to FIG. 16, an inspection system as a second embodiment of the present invention will now be described.

The inspection system of this embodiment is different from the first embodiment in that an inspection circuit wiring is not compared with the gold sample but with a design image data (e.g. CAD data). Since other points are the same as those of the first embodiment, the description will be omitted herein and the same components will be defined by the same reference numerals in the figure.

FIG. 16 is a flow chart showing a processing in which a preliminary inspection is performed before starting the inspection and then the displacement of the circuit board is measured.

At the step S181, two or three circuit wirings on a circuit board as an inspection subject are inspected in one frame as pre-processing circuit wirings (marks). Specifically, an image data is formed which represents the shapes of 2 or 3 marks provided with leaving a distance vertically therebetween on the circuit board.

At the step S182, horizontal noise is eliminated. This is performed by horizontally averaging the data corresponding to 10 dots on the left edge of the picked-up image and subtracting the averaged value from the value of the original entire image data.

At the step S183, it is determined whether the marks have been repeatedly read 10 times. If not completed, the process returns to the step S181 to repeat reading the marks. When the inspection for 10 frames is completed, the process will proceed to the step S184.

At the step S184, the image data for 10 frames are averaged, and then the averaged data is passed through a median filter at the step S185 to eliminate local noise.

At the step S186, contrast is corrected. Then, the median point of the mark image is obtained at the step S187, and the displacement (coordinate displacement and angular displacement) between the median point of the mark image and the median point of the mark in the design image data (e.g. CAD data) is obtained at the step S188.

At the step S189, the actual inspection and image processing are carried out. In this step, the position of the generated image data is corrected based on the displacement value obtained at the step S188. The data processing in the actual inspection is substantially the same as that shown in FIG. 15, but is different only in that a coordinate transformation processing for one line data is inserted between the step S159 and the step S160.

According to this embodiment, in an actual inspection, the generated image data can be accurately compared with the design image data representing the design circuit wirings, and thereby defects in the circuit wirings 101, such as disconnection, short-circuit and chipping, can be detected with a high degree of accuracy.

Third Embodiment

Figure 17:
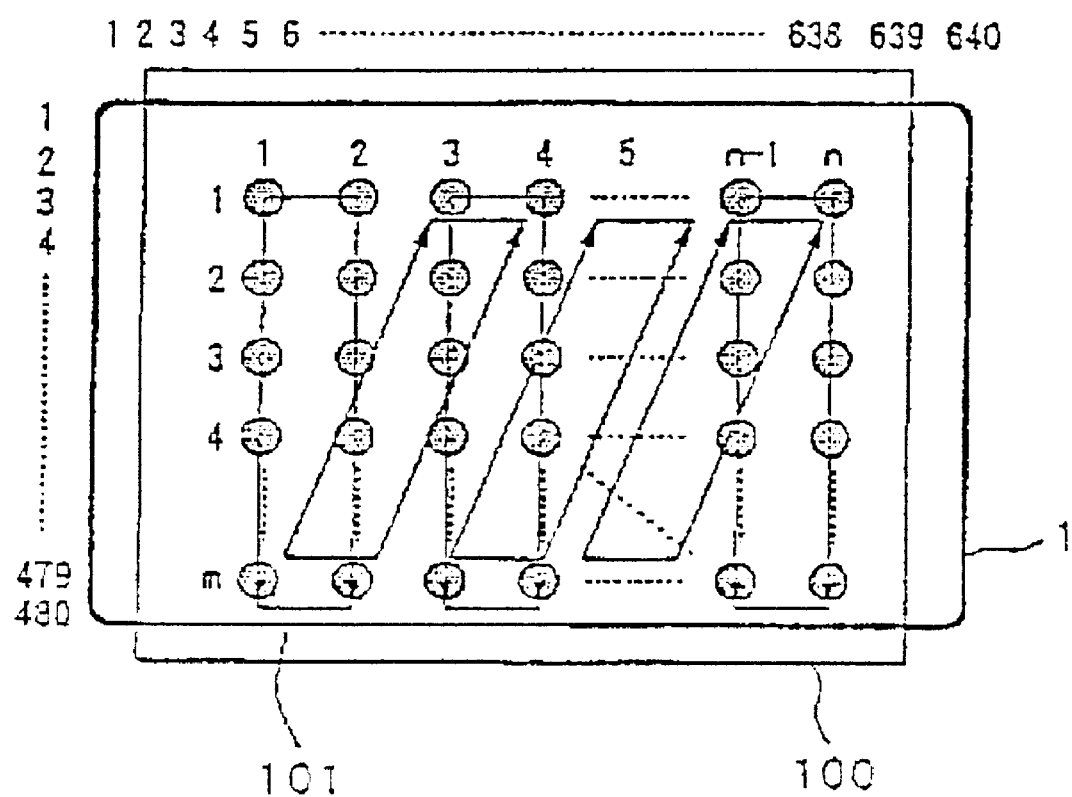
FIG. 17 is an explanatory diagram of the sequence for applying a voltage to a plurality of circuit wirings circuit provided in one circuit board wirings, in an inspection system according to a third embodiment of the present invention.
Figure 18:
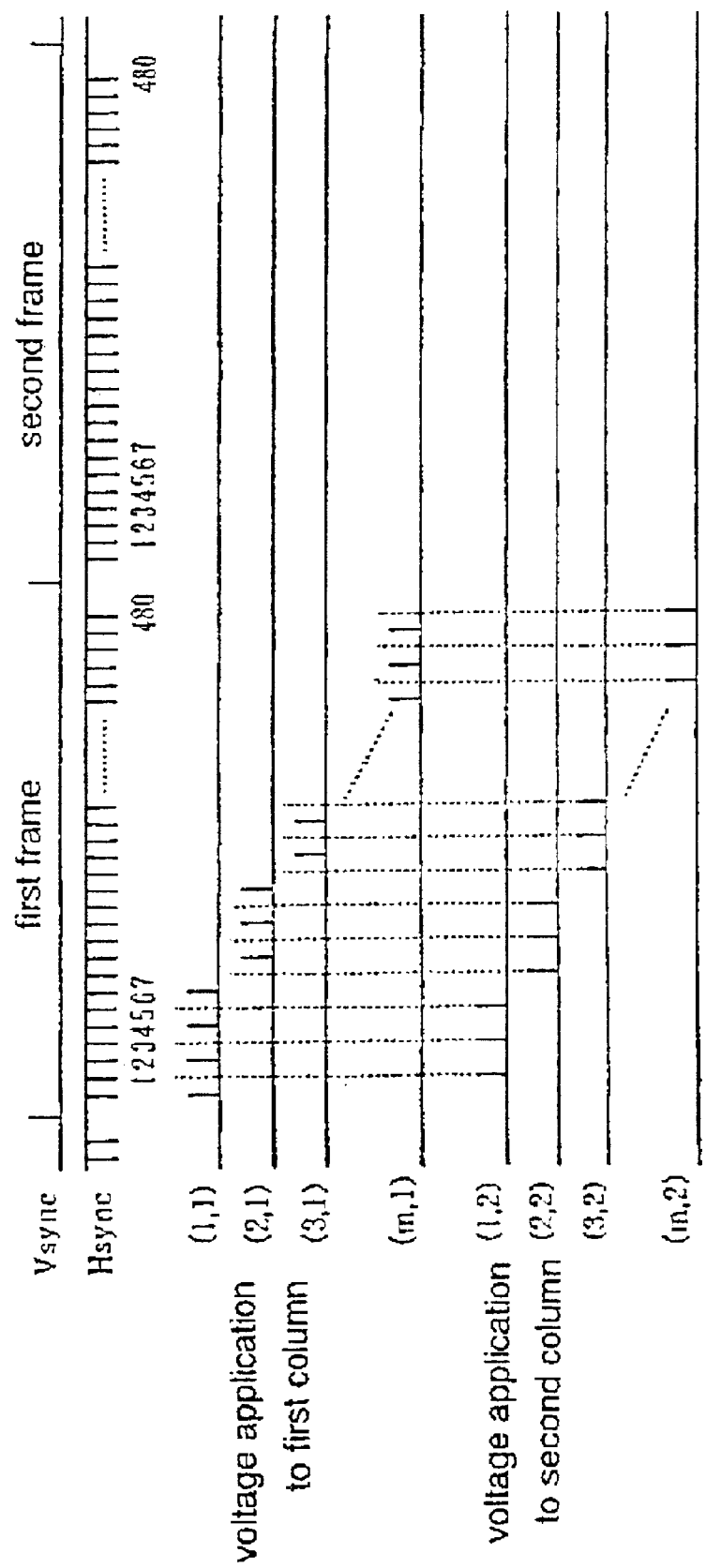
FIG. 18 is a timing chart showing an example of the timing for applying a voltage to the circuit wirings in FIG. 17.
Figure 19:
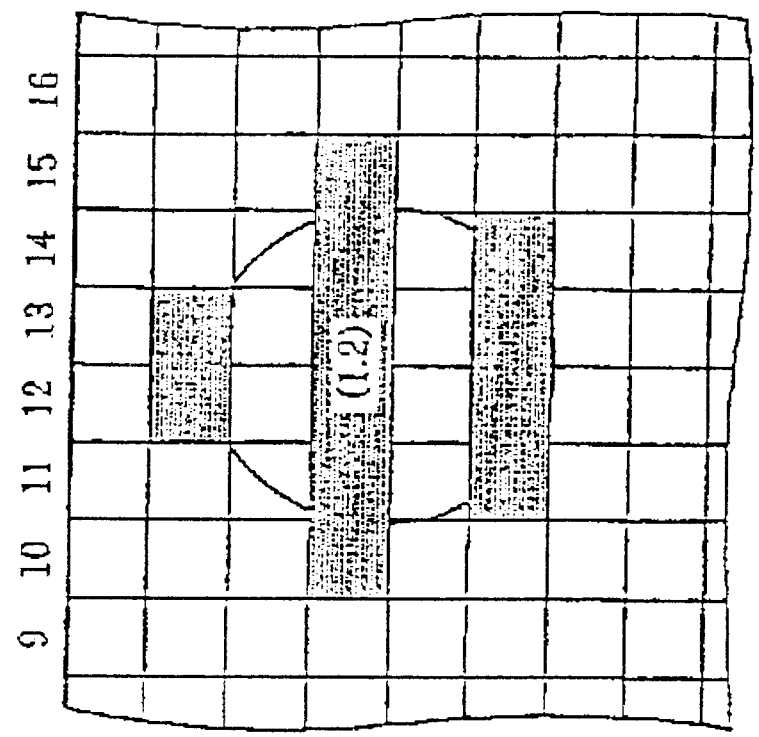
FIG. 19 shows an output image in case of applying a voltage at the timing in FIG. 18.
Figure 19:
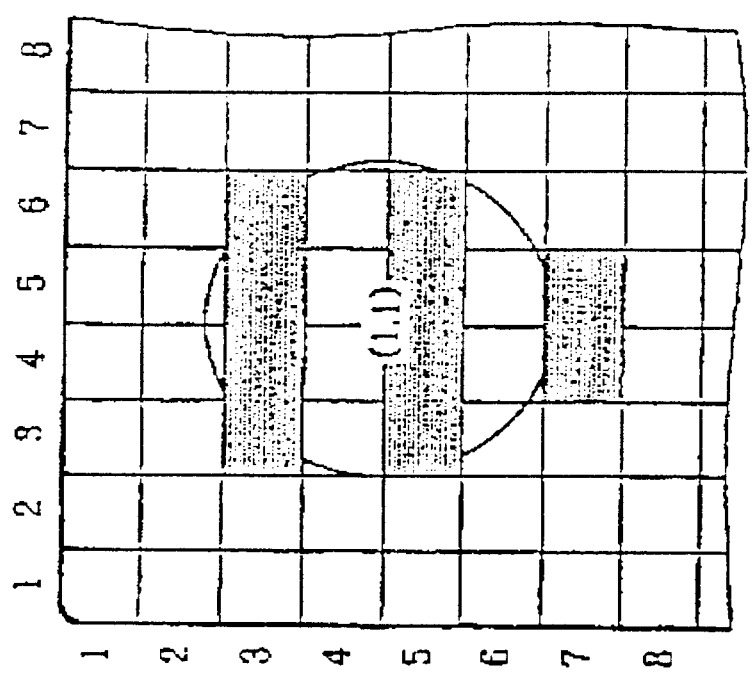

With reference to FIGS. 17 to 19, an inspection system as a third embodiment of the present invention will now be described.

The inspection system of this embodiment is different from the first embodiment in that two adjacent circuit wiring lines are inspected simultaneously within one frame. Since other points are the same as those of the first embodiment, the description will be omitted herein and the same components will be defined by the same reference numerals in the figure.

FIG. 17 is an explanatory diagram of a sequence for applying a voltage to a plurality of circuit wirings provided on a circuit board. In FIG. 17, for simplifying the description as with FIG. 1, the inspection circuit wirings are indicated by ○ and arranged in a matrix form of m rows×n columns.

As shown in the figure, according to this embodiment, in the first frame, the voltage is applied to the circuit wirings aligned in the first and second columns sequentially in the vertical direction of the figure from above, or in order the first row, the second row, - - - , and the m-th row. In the second frame, the voltage is also applied to the circuit wirings arranged in the third and fourth columns sequentially in the vertical direction of the figure from above. Thus, in the n/2-th frame, all of the circuit wirings will be applied with the voltage.

FIG. 18 is a timing chart showing an example of the timing for applying the voltage to the circuit wirings shown in FIG. 17.

As shown in this figure, in response to each of the first, third, fifth and seventh Hsyncs in the first frame (in the interval from the first Vsync to second Vsync), the voltage is applied to the circuit wiring arranged in the first row and the first column or (1, 1). Then, in response to each of the second, fourth, sixth and eighth Hsyncs, the voltage is applied to the circuit wiring arranged in the first row and the second column or (1, 2). Further, in response to each of the ninth, eleventh, - - - Hsyncs, the voltage is applied to the circuit wiring arranged in the first column, and then in response to each of the tenth, twelfth, - - - Hsyncs, the voltage is applied to the circuit wiring arranged in the second column (1, 2).

In the same manner, the voltage is applied in the second and succeeding frames. Specifically, the voltage is applied to the circuit wirings in the odd columns in response to the odd Hsyncs, and the voltage is applied to the circuit wirings in the even columns in response to the even Hsyncs.

That is, the timing for inputting the select signal, the timing for detecting the voltage variation from the sensor element line, and the timing for supplying the inspection signal to the circuit wirings are controlled to drive the sensor elements in the odd lines so as to detect the circuit wirings in the first column and to drive the sensor elements in the even lines so as to detect the circuit wirings in the second column.

In other words, the timing for applying the voltage to one circuit wiring is provided to skip over one sensor element line, or at the interval of one sensor element line. The image data will appears by skipping over one sensor element line.

As a result, the image for each of the circuit wirings in the odd columns is displayed only by the odd sensor element lines (FIG. 19(a)), and the image for each the circuit wirings in the even columns is displayed only by the even sensor element lines (FIG. 19(b)).

In this manner, by applying the voltage alternately to the circuit wirings in the odd columns and the circuit wirings in the even columns in a same frame, the inspection time can be shortened half.

The profile of the entire circuit wiring can be obtained by processing the image data and interpolating vacant lines.

Further, depending on the resolution of the sensor elements, the inspection of the circuit wirings in the plural columns may be performed within one frame period. For example, when the inspecting of the circuit wirings in five columns is performed within one frame period, the voltage may be applied to the same circuit wiring at every 5 Hsyncs.

Forth Embodiment

Figure 20:
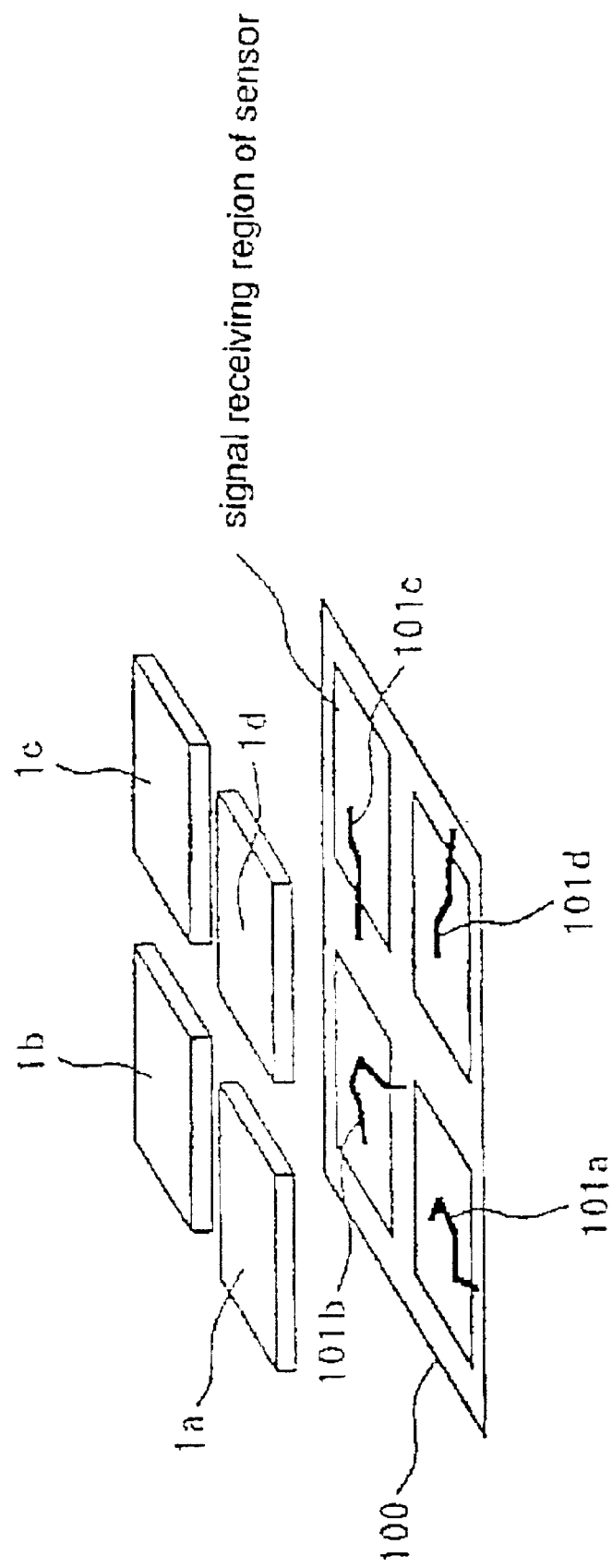
FIG. 20 shows the state when four sensor chips are driven simultaneously for one circuit board, in an inspection system according to a forth embodiment of the present invention.
Figure 21:
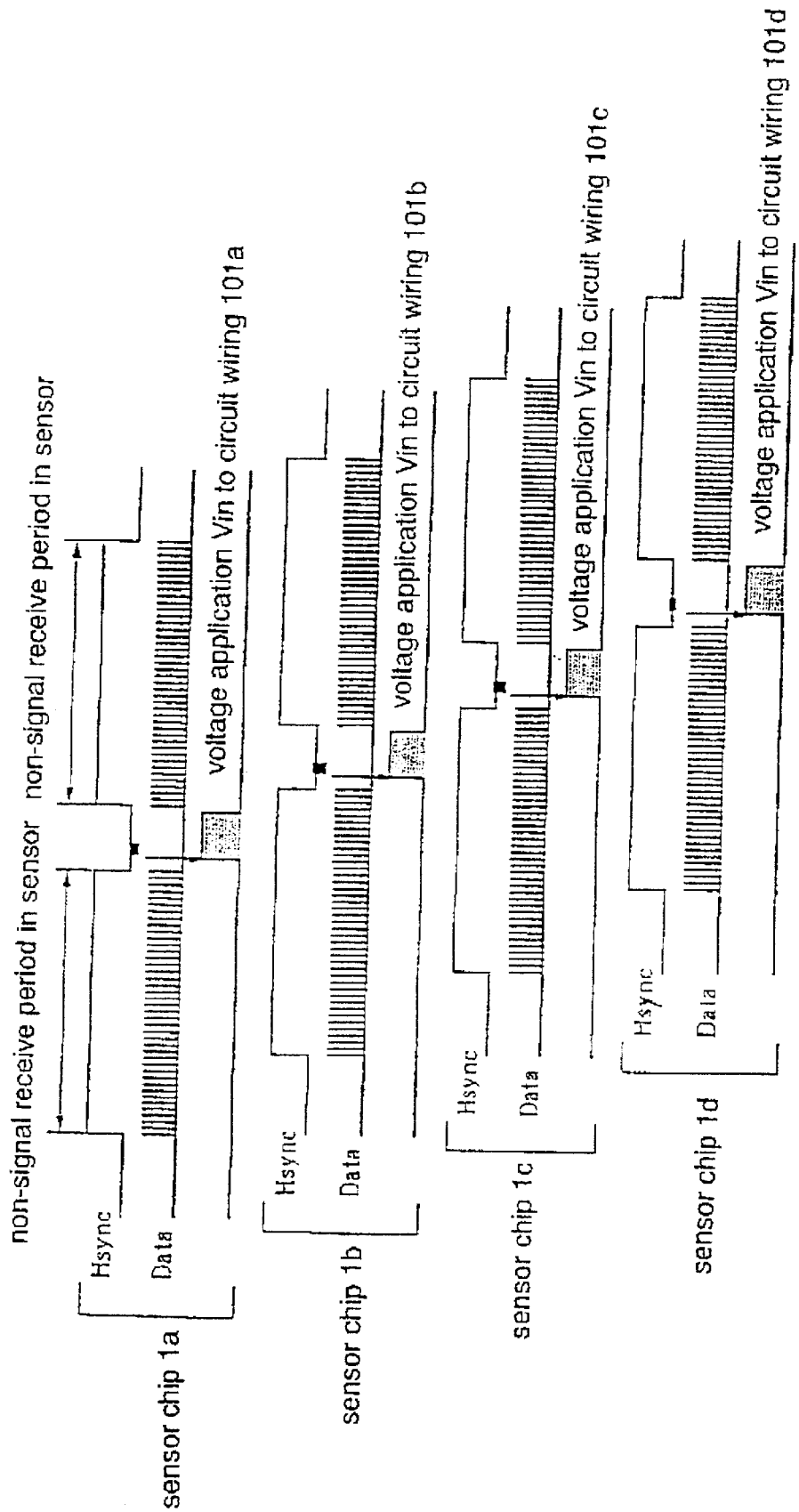
FIG. 21 is a timing chart showing each timing for driving the sensor chips and applying the voltage to circuit wirings in FIG. 20.
Figure 22:
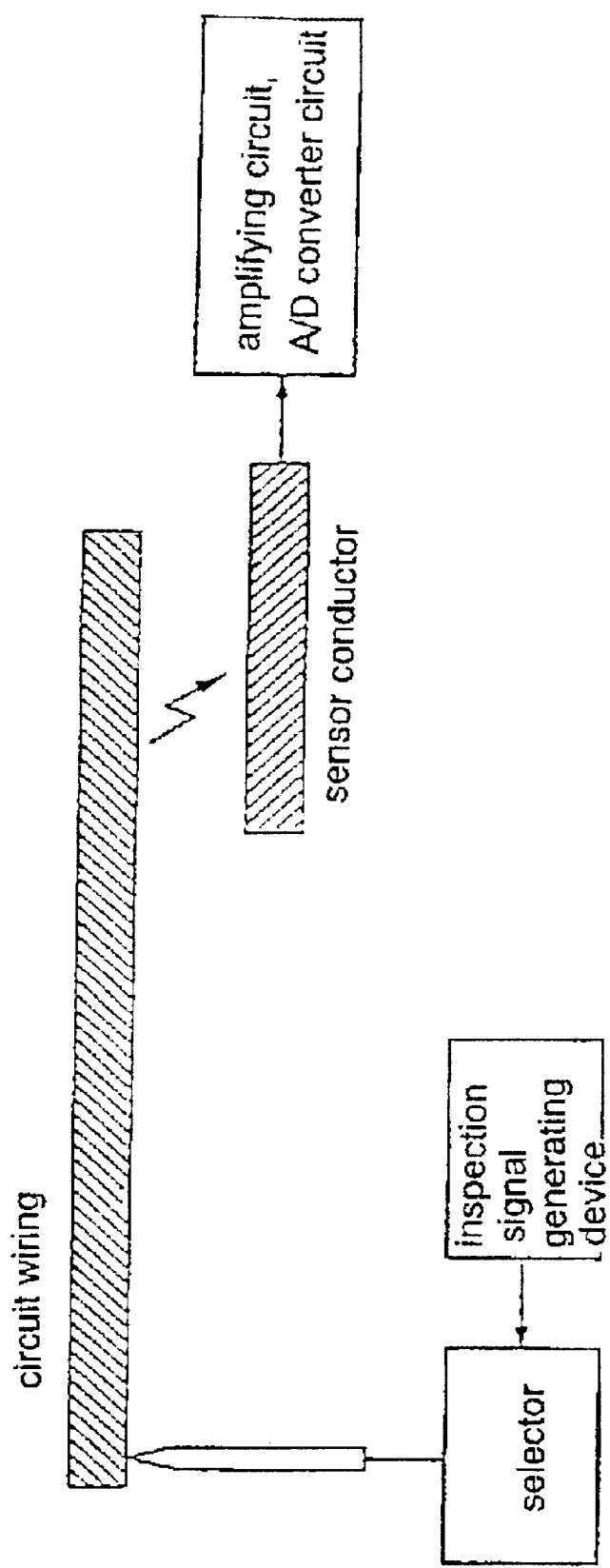
FIG. 22 is an explanatory diagram of a conventional inspection apparatus for circuit boards.

With reference to FIGS. 20 and 21, an inspection system as a forth embodiment of the present invention will now be described.

The inspection system of this embodiment is different from the first embodiment in that this inspection system includes a plurality of sensor chips. Since other points are the same as those of the first embodiment, the description will be omitted herein.

FIG. 20 shows the state when four separate sensor chips are driven simultaneously to reduce the inspection time, wherein a circuit board is larger than the signal receiving region of one sensor chip.

FIG. 21 is a timing chart showing the timing for applying a voltage in FIG. 20.

In order to drive four sensor chips simultaneously, a common Hsync may be simply applied to the four sensor chips. That is, the four sensor chips will be driven with matching the phase of each synchronizing signal.

However, in this case, considering that the voltage cannot be applied simultaneously to a plurality of circuit wirings, the inspection for the region of the sensor chip 1a is completed, and then the inspection for the region area of the sensor chip 1b is performed. Then, the sensor chips 1c and 1d are sequentially selected to inspect. In this process, if there are the circuit wirings requiring n frames for each sensor chip, it is necessary to have the inspection period for 4n frames.

Thus, as shown in the timing chart of FIG. 21, the Hsyncs for these four independent sensor chips are dephased, respectively, and the voltage is applied to the four circuit wirings within one frame period. This takes advantage of the fact that the voltage application to the other circuit wirings has no influence to own image excepting in the period when the sensor element reads out the data of horizontal lines.

For this purpose, the Hsyncs may be slightly dephased each other so as not to overlap the timing for applying the voltage to the four circuit wirings 101a, 101b, 101c, and 101d. According to this process, by securing the fundamental rule not to apply the voltage simultaneously to different circuit wrings, a plurality of circuit wirings can be inspected within one frame period.

As a result, compared with the above case in which respective phase of the Hsyncs for the four sensor chips are matched, the inspection time can be reduced one-quarter.

INDUSTRIAL APPLICABILITY

The present invention can provide an inspection apparatus and an inspection method capable of intuitively inspecting each shape of circuit wirings.

What is claimed is:

1. An inspection apparatus for inspecting a circuit wiring on a circuit board, said inspection apparatus comprising:
   supply means for supplying an inspection signal to said circuit wiring;
   detecting means for detecting potential variation appearing in said circuit wiring in response to said inspection signal, comprising:
      a plurality of probes to apply a voltage to the circuit wiring on the circuit board;
      a sensor chip having a plurality of sensor elements arranged in rows and columns connected to a vertical select section for selecting sensor element lines and a lateral select section for picking up signals from a sensor element of the plurality of sensor elements when voltage is applied to a probe of the plurality of probes; and
   image data generating means for generating an image data representing the shape of said circuit wiring, by use of positional information of said sensor elements which have detected the potential variation.

2. An inspection apparatus as defined in claim 1, wherein said supply means is adapted to supply said inspection signal to a different circuit wiring at a different timing from that of said circuit wiring.

3. An inspection apparatus as defined in claim 1, which further includes selecting means for supplying a select signal to selectively drive a part of said plural sensor elements located in a given region of said circuit board.

4. An inspection apparatus as defined in claim 1, wherein
   said plural sensor elements are arranged in a matrix form,
   said selecting means is adapted to input said select signal simultaneously into plural sensor element lines which are formed by said plural sensor elements and each of which is aligned horizontally in one line, and
   said detecting means is adapted to simultaneously detect the potential variation appearing in said circuit wiring opposed to said sensor element lines.

5. An inspection apparatus as defined in claim 4, which further includes timing control means for controlling the timing for inputting said select signal to said sensor element lines, the timing for detecting the potential variation from said sensor element lines, and the timing for supplying said inspection signal to said circuit wiring.

6. An inspection apparatus as defined in claim 5, wherein
   said circuit wiring includes a first circuit wiring and a second circuit wiring,
   said selecting means is adapted to drive all of said sensor elements by sequentially inputting said select signal to said sensor element lines, said detecting means is adapted to detect the potential variation from all of said sensor elements in conformity with the timing for inputting said select signal from said selecting means, wherein when a first set of the sensor element lines capable of detecting the potential variation in said first circuit wiring and a second set of the sensor element lines capable of detecting the potential variation in said second circuit wiring are not overlapped at all, said supply means is adapted to supply said inspection signal to said first and second circuit wirings within the same frame, where a period in which all of said sensor elements are driven once is defined as one frame, and when said first and second sets of the sensor element lines are overlapped each other, said supply means is adapted to supply said inspection signal to said first and second circuit wirings in different frames.

7. An inspection apparatus as defined in claim 5, wherein said circuit wiring includes a first circuit wiring and a second circuit wiring, said selecting means is adapted to drive all of said sensor elements by sequentially inputting said select signal vertically to said sensor element lines, said detecting means is adapted to detect the potential variation from all of said sensor elements in conformity with the timing for inputting said select signal from said selecting means, wherein when a first set of the sensor element lines capable of detecting the potential variation in said first circuit wiring and a second set of the sensor element lines capable of detecting the potential variation in said second circuit wiring are overlapped each other, said supply means is adapted to supply said inspection signal to said first and second circuit wirings within the same frame in different timings, where a period in which all of said sensor elements are driven once is defined as one frame.

8. An inspection apparatus as defined in claim 7, wherein said timing control means is adapted to control the timing for inputting said select signal, the timing for detecting the potential variation from said sensor element lines, and the timing for supplying said inspection signal to said circuit wirings, so as to drive said first set of the sensor element lines which are arranged at the interval of n lines and provided for detecting said first circuit wiring, and said second set of the sensor element lines which are arranged differently from said first set of the sensor element lines at the interval of n lines and provided for detecting said second circuit wiring.

9. An inspection apparatus as defined in claim 7, wherein said timing control means is adapted to control the timing for inputting said select signal, the timing for detecting the potential variation from said sensor element lines, and the timing for supplying said inspection signal to said circuit wirings, so as to drive said first set of the sensor element lines which are arranged at odd lines and provided for detecting said first circuit wiring, and said second set of the sensor element lines which are arranged at even lines and provided for detecting said second circuit wiring.

10. An inspection apparatus as defined in claim 8, wherein said image data generating means is adapted to generate the image data representing each shape of said first and second circuit wirings through an image interpolation process.

11. An inspection apparatus as defined in claim 9, wherein said image data generating means is adapted to generate the image data representing each shape of said first and second circuit wirings through an image interpolation process.

* * * * *